(12) United States Patent
Okada et al.

(10) Patent No.: US 9,613,838 B2
(45) Date of Patent: Apr. 4, 2017

(54) BATCH-TYPE VERTICAL SUBSTRATE PROCESSING APPARATUS AND SUBSTRATE HOLDER

(71) Applicant: TOKYO ELECTRON LIMITED, Tokyo (JP)

(72) Inventors: Mitsuhiro Okada, Nirasaki (JP); Kazuhide Hasebe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 302 days.

(21) Appl. No.: 14/221,334

(22) Filed: Mar. 21, 2014

(65) Prior Publication Data

US 2014/0283750 A1    Sep. 25, 2014

(30) Foreign Application Priority Data

Mar. 21, 2013  (JP) ................................. 2013-059042
Feb. 12, 2014  (JP) ................................. 2014-024642

(51) Int. Cl.
*C23C 16/458*  (2006.01)
*C23C 16/54*  (2006.01)
(Continued)

(52) U.S. Cl.
CPC ...... *H01L 21/6719* (2013.01); *C23C 16/4584* (2013.01); *C23C 16/54* (2013.01); *H01L 21/67303* (2013.01); *H01L 21/67757* (2013.01)

(58) Field of Classification Search
CPC ............ C23C 16/452; C23C 16/45517; C23C 16/45546; C23C 16/45548;
(Continued)

(56) References Cited

U.S. PATENT DOCUMENTS 6,204,194 B1 *  3/2001  Takagi ................ C23C 16/4412
                                                              257/E21.279
6,939,132 B2 *  9/2005  Loo ................... H01L 21/67309
                                                                    206/711
(Continued)

FOREIGN PATENT DOCUMENTS

JP    2002-222806 A    8/2002
JP    2007-109711 A    4/2007
(Continued)

*Primary Examiner* — Gordon R Baldwin
*Assistant Examiner* — Benjamin Kendall
(74) *Attorney, Agent, or Firm* — Nath, Goldberg & Meyer; Jerald L. Meyer

(57) ABSTRACT

A batch-type vertical substrate processing apparatus includes a processing chamber into which a substrate holder configured to stack and hold a plurality of target substrates in a height direction is inserted; and a plurality of flanges formed to protrude from an inner wall of the processing chamber toward an internal space of the processing chamber along a planar direction and configured to divide the interior of the processing chamber into a plurality of processing subspaces along the height direction, wherein the flanges include insertion holes through which the substrate holder is inserted, and diameters of the insertion holes are small at an upper side of the processing chamber and become gradually larger toward a lower side of the processing chamber.

17 Claims, 25 Drawing Sheets

(51) Int. Cl.
*H01L 21/67* (2006.01)
*H01L 21/673* (2006.01)
*H01L 21/677* (2006.01)

(58) Field of Classification Search
CPC .......... C23C 16/45591; C23C 16/4584; C23C 16/4585; C23C 16/54; H01L 21/67109; H01L 21/67115; H01L 21/6719; H01L 21/67303–21/67309; H01L 21/67757; H01L 21/683

See application file for complete search history.

(56) References Cited

U.S. PATENT DOCUMENTS

| | | | | |
|---|---|---|---|---|
| 2001/0029108 | A1* | 10/2001 | Tometsuka | C23C 16/4409 438/770 |
| 2003/0049372 | A1* | 3/2003 | Cook | C23C 16/345 427/248.1 |
| 2008/0173238 | A1* | 7/2008 | Nakashima | C23C 16/345 118/723 R |
| 2013/0256962 | A1* | 10/2013 | Ranish | B05C 13/00 269/11 |
| 2014/0256152 | A1* | 9/2014 | Ogawa | C23C 16/405 438/758 |

FOREIGN PATENT DOCUMENTS

| | | |
|---|---|---|
| JP | 2008-172205 A | 7/2008 |
| JP | 2010132958 A * | 6/2010 |
| JP | 2011-512031 A | 4/2011 |
| JP | 2012-178390 A | 9/2012 |
| WO | 2013/054652 A1 | 4/2013 |

* cited by examiner

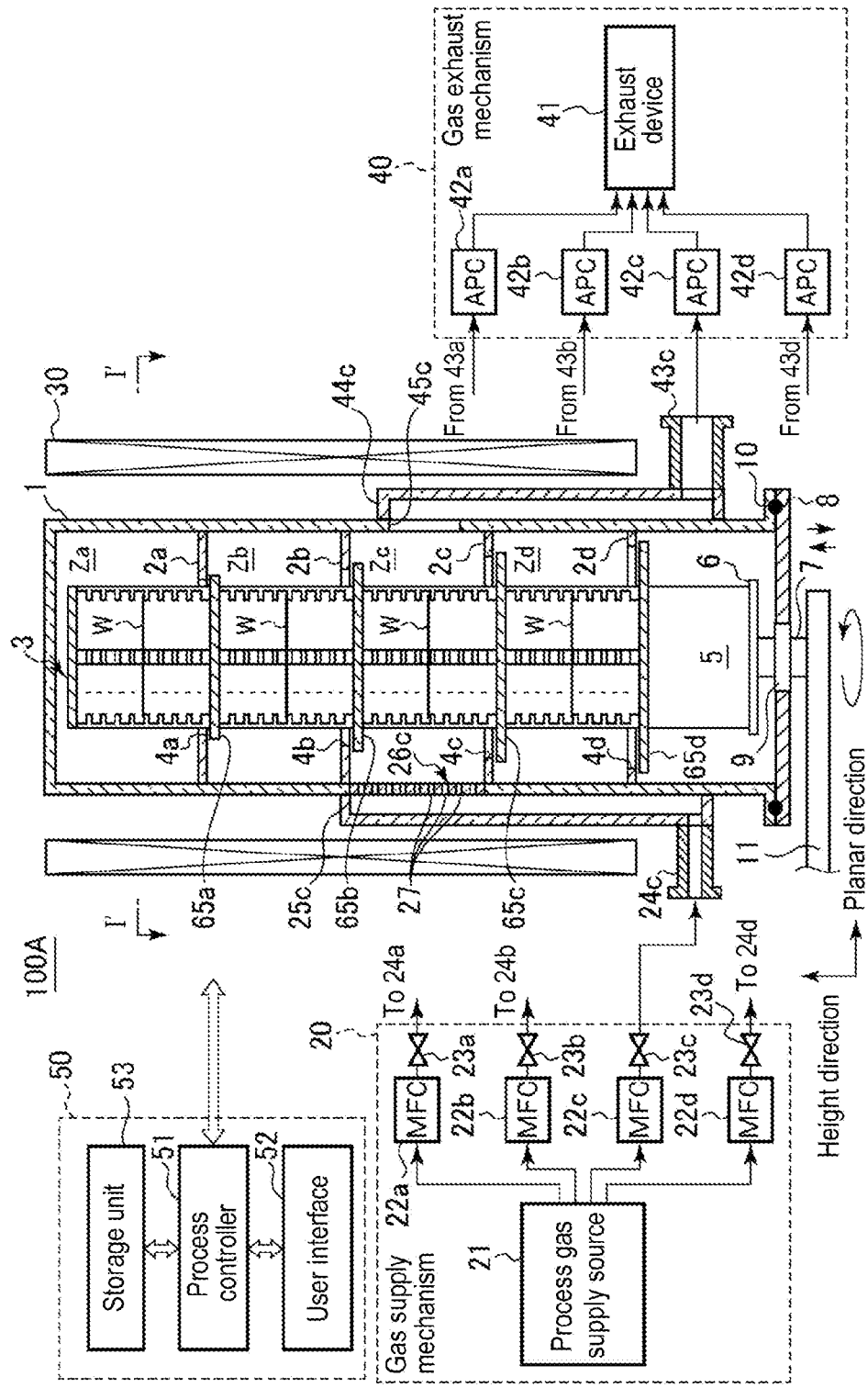

FIG. 3A
FIG. 3B
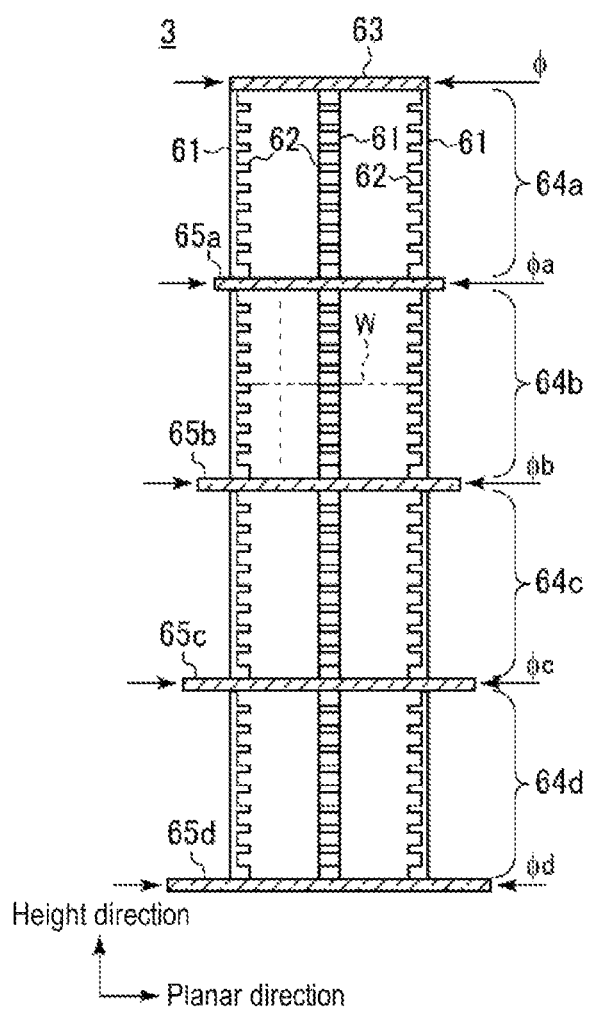
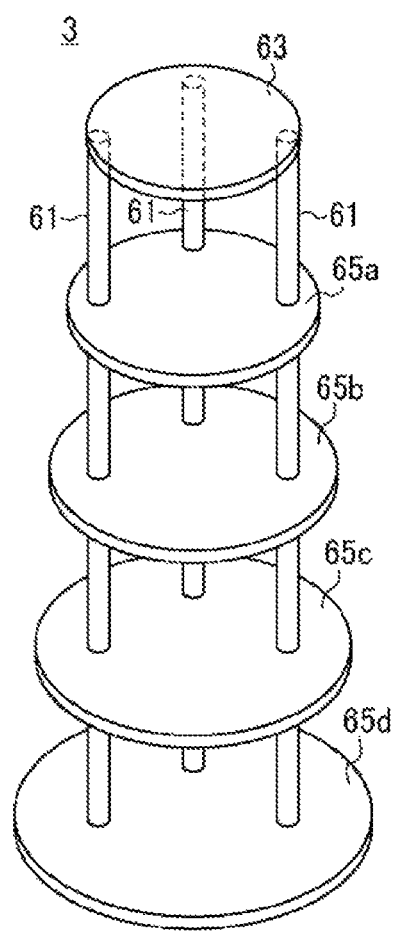

Comparative example

Comparative example

Comparative example

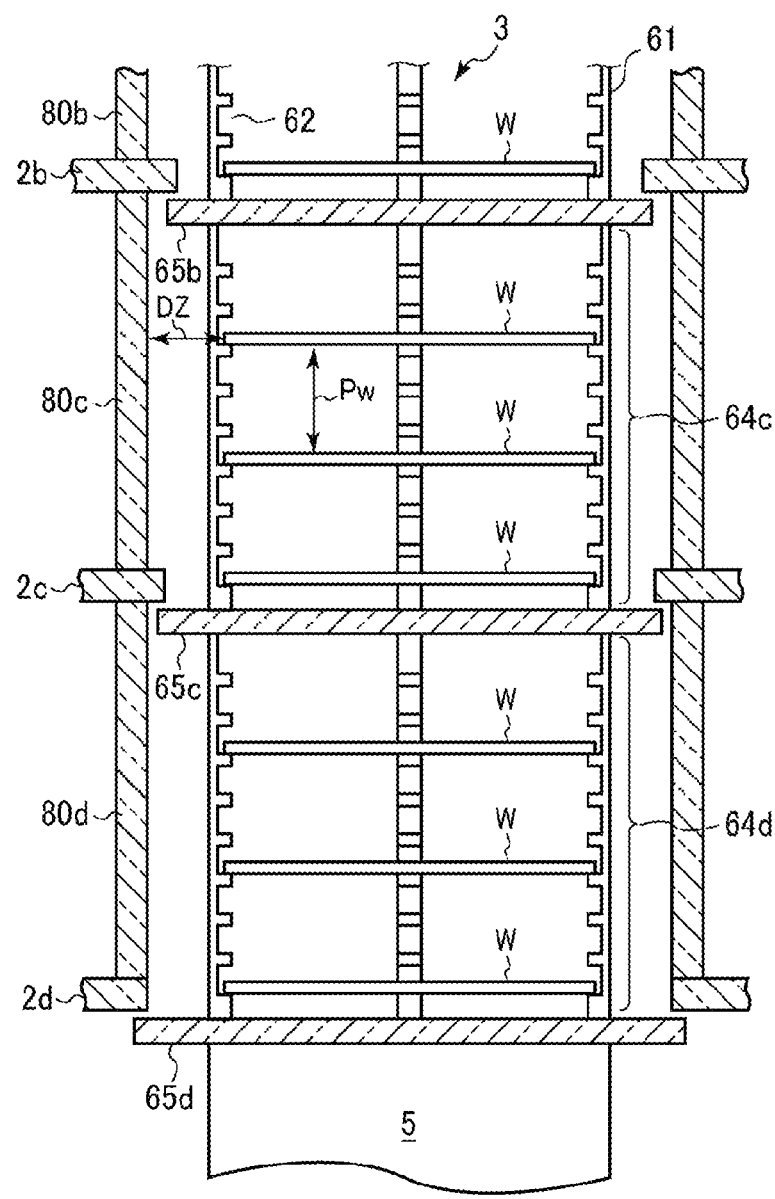

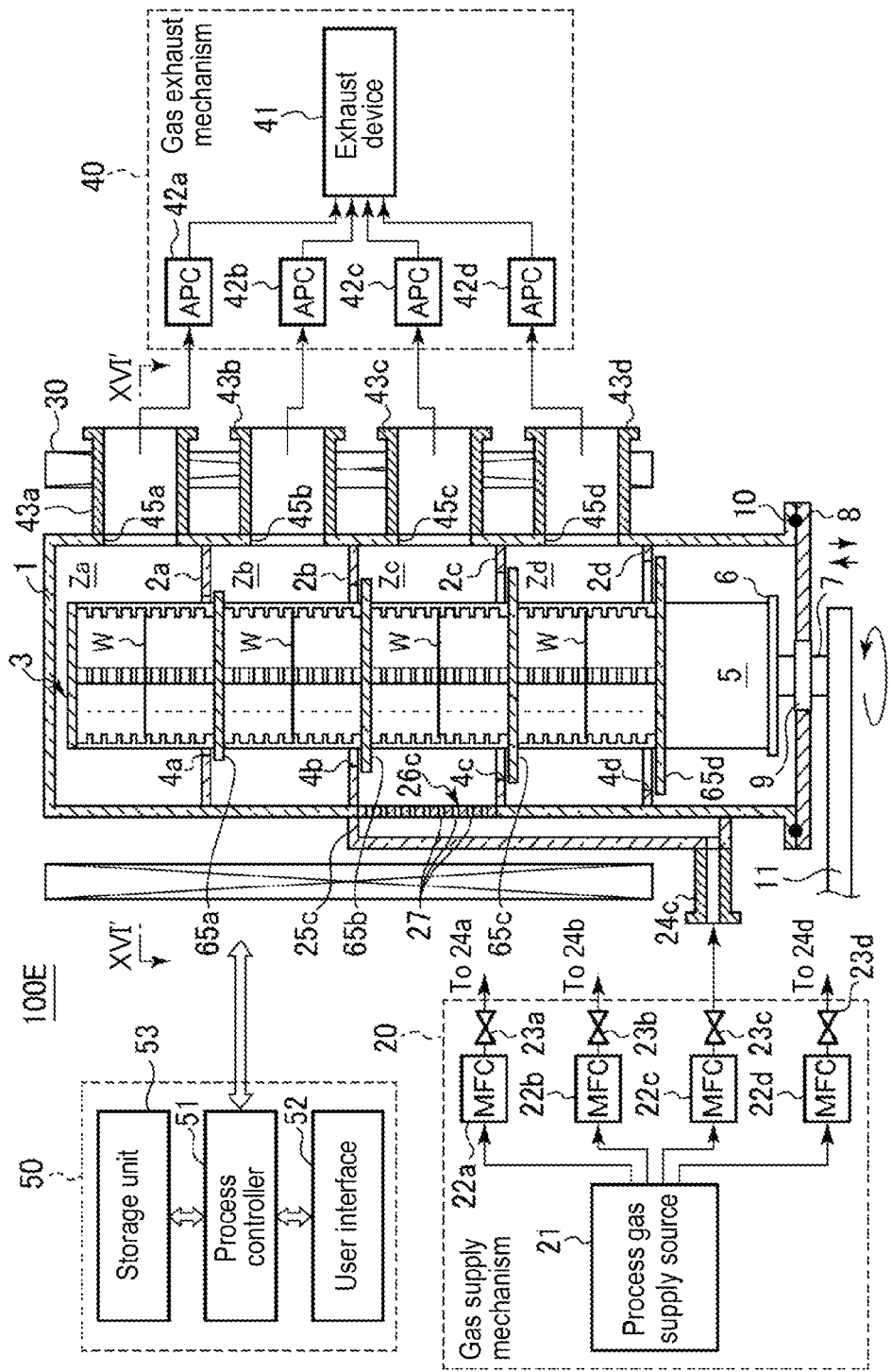

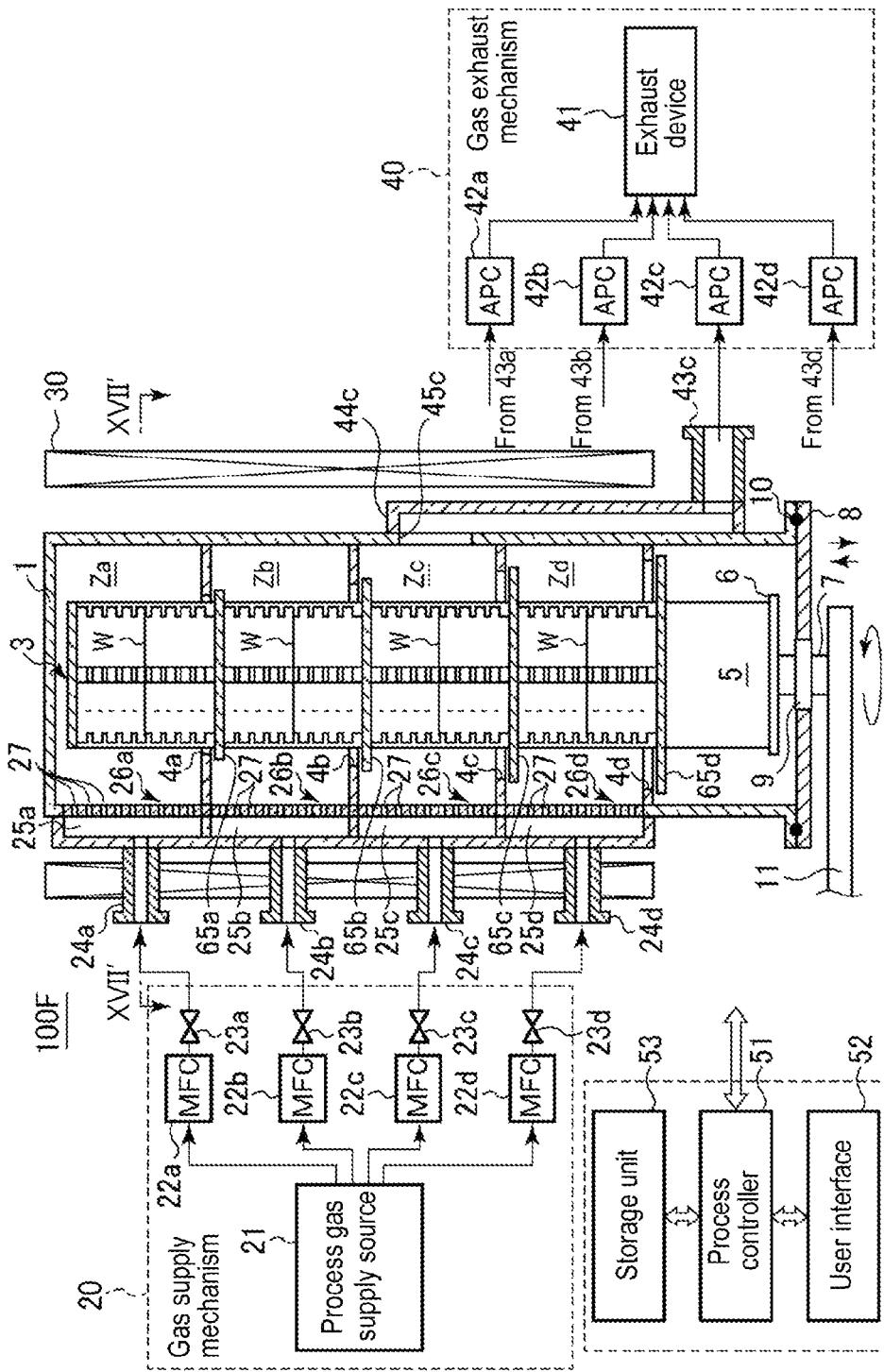

BATCH-TYPE VERTICAL SUBSTRATE PROCESSING APPARATUS AND SUBSTRATE HOLDER

CROSS-REFERENCE TO RELATED APPLICATIONS

This application claims the benefit of Japanese Patent Application Nos. 2013-059042, filed on Mar. 21, 2013 and 2014-024642, filed on Feb. 12, 2014, in the Japan Patent Office, the disclosures of which are incorporated herein in their entirety by reference.

TECHNICAL FIELD

The present disclosure relates to a batch-type vertical substrate processing apparatus and a substrate holder.

BACKGROUND

In a manufacturing process of an electronics product, e.g., a manufacturing process of a semiconductor integrated circuit device, various kinds of processing such as film forming, oxidizing, nitriding, diffusing of donors and acceptors, annealing and the like are repeatedly performed on a substrate (a semiconductor wafer).

Miniaturization and high integration of a semiconductor integrated circuit device are currently being developed. As semiconductor elements are miniaturized, a degree of integration of a semiconductor integrated circuit device is improved. Along with this, it can be also further developed to increase an operation speed of the semiconductor integrated circuit device. A recently-available semiconductor integrated circuit device is being integrated in a height direction to meet the requirement of a higher integration degree. With respect to a semiconductor element per se, improvement and development are made day by day in order to obtain more stable electric properties.

If the integration in the height direction or the improvement and development of the semiconductor elements progress, the time necessary for manufacturing one semiconductor integrated circuit device increases. This is because the number of processing procedures required in the manufacture of one semiconductor integrated circuit device increases. For example, if the integration progresses in the height direction, the number of processing procedures such as the number of film forming procedures or the like increases. In an improved or newly-developed semiconductor element, different conductive layers are stacked or a stress liner film for controlling a stress is formed in order to stabilize electric properties. This may also become one cause of increasing the number of processing procedures such as the number of film forming procedures or the like.

As mentioned above, the miniaturization and high integration of a semiconductor integrated circuit or the progress of the improvement and development of a semiconductor element leads to an increase of the number of processing procedures in a manufacturing process and becomes one cause of prolonging a manufacturing time necessary for one semiconductor integrated circuit device. In order to prevent the prolonging of the manufacturing time, it is important to enhance a throughput in each of the processing steps.

One solution of enhancing a throughput in each of the processing steps is batch-type processing by which a plurality of semiconductor wafers is processed at one time. A substrate processing apparatus for performing the batch-type processing has been introduced in the related art. The conventional substrate processing apparatus is a batch-type vertical substrate processing apparatus.

In the batch-type vertical substrate processing apparatus, however, a processing chamber tends to become taller in a height direction in order to process a plurality of semiconductor wafers at one time. For that reason, it may be difficult to uniformly supply a process gas such as a film forming source gas or the like into the processing chamber, so that it will be difficult to secure the wafer in-plane and wafer inter-plane uniformity of thickness of a thin film to be formed.

Thus, in the conventional batch-type vertical substrate processing apparatus, gas introduction division units for defining a plurality of gas introduction portions in a height direction with respect to the processed surfaces of semiconductor wafers are installed in a gas introduction pipe so that a process gas used in the processing can flow toward the respective gas introduction division units.

In a wafer boat (hereinafter referred to as a substrate holder) for stacking and holding a plurality of semiconductor wafers in a height direction, processing division walls (hereinafter referred to as division plates) for dividing a holding part of the substrate holder into a plurality of processing parts (hereinafter referred to as processing subspaces) are installed along the height direction so that the process gas can be supplied from the gas introduction division units to the respective processing subspaces.

In the related art, an interior of a large processing chamber is divided into a plurality of processing subspaces and a process gas is supplied to the respective processing subspaces, thereby enhancing the wafer in-plane and wafer inter-plane uniformity of thickness of a thin film to be formed.

The substrate holder is rotated during the processing. In order to rotate the substrate holder, the division plates of the substrate holder should not make contact with the gas introduction division walls. Accordingly, a clearance (gap) portion is set between the division plates and the gas introduction division walls. In the related art, the clearance portion is set between side surface portions of the division plates extending in the height direction and side surface portions of the gas introduction division walls extending in the height direction.

However, the substrate holder employed in the batch-type vertical substrate processing apparatus is tall in the height direction. While the substrate holder is fabricated to have extremely accurate perpendicularity in the height direction, a small tolerance is predicted in an "inclination" thereof. For that reason, during the rotation of the substrate holder, the substrate holder makes a "swing movement (precession movement)" within a range of the tolerance. An "amplitude" generated in the substrate holder by the "precession movement" becomes larger as the number of semiconductor wafers held by the substrate holder grows larger and as the substrate holder grows taller.

The substrate holder is mounted on a heat insulating tube or a table such that a "deviation (an eccentricity from a rotation center)" does not exist between a center of the substrate holder and a rotation center of the heat insulating mound or the table. However, a tolerance is involved even in this case. When the substrate holder is rotated, the tolerance associated with the mounting position may generate an "amplitude" in the substrate holder.

Under these circumstances, in the substrate holder having an increased height, there is a case that has to secure a distance of the clearance portion of at least about 10 mm if a safety margin for the reliable avoidance of contact is predicted.

The clearance portion is needed to rotate the substrate holder. However, if the clearance portion becomes larger in size, the sealability between the processing subspaces deteriorates. Thus, a process gas may leak from one processing subspace to another processing subspace, or vice versa. For that reason, there may be a situation that the concentration, the flow rate and the like of a process gas existing in the processing subspaces become difficult to control and further that the wafer in-plane and wafer inter-plane uniformity of thickness of a thin film to be formed gets worse again.

SUMMARY

Some embodiments of the present disclosure provide a batch-type vertical substrate processing apparatus which can suppress deterioration of sealability of processing subspaces even if a substrate holder becomes tall, and a substrate holder which can be suitably used in the batch-type vertical substrate processing apparatus.

According to one embodiment of the present disclosure, there is provided a batch-type vertical substrate processing apparatus, including: a processing chamber into which a substrate holder configured to stack and hold a plurality of target substrates in a height direction is inserted; a heating device installed outside the processing chamber and configured to heat an interior of the processing chamber; a plurality of flanges formed to protrude from an inner wall of the processing chamber toward an internal space of the processing chamber along a planar direction and configured to divide the interior of the processing chamber into a plurality of processing subspaces along the height direction; a gas supply mechanism configured to supply a process gas into the processing subspaces; and a gas exhaust mechanism configured to exhaust the process gas from the processing subspaces, wherein the flanges include insertion holes through which the substrate holder is inserted, and diameters of the insertion holes are small at an upper side of the processing chamber and become gradually larger toward a lower side of the processing chamber.

According to another embodiment of the present disclosure, there is provided a substrate holder which stacks and holds a plurality of target substrates in a height direction, including: a holding part configured to stack and hold the target substrates in the height direction; and a plurality of division plates configured to divide the holding part into a plurality of processing subspace holding parts along the height direction, wherein diameters of the division plates are small at an upper side of the substrate holder and become gradually larger toward a lower side of the substrate holder.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1A is a vertical sectional view showing a batch-type vertical substrate processing apparatus according to one example of a first embodiment.

FIG. 3A is a vertical sectional view showing an illustrative embodiment of a substrate holder used in the batch-type vertical substrate processing apparatus according to one example of the first embodiment, and FIG. 3B is a perspective view thereof.

FIG. 9 is a vertical sectional view showing an example of holding substrates in the batch-type vertical substrate processing apparatus according to a first modified example of a first embodiment.

FIG. 16A is a vertical sectional view showing a batch-type vertical substrate processing apparatus according to one example of a third embodiment.

FIG. 17A is a vertical sectional view showing a batch-type vertical substrate processing apparatus according to one example of a fourth embodiment.

DETAILED DESCRIPTION

Embodiments of the present disclosure will now be described with reference to the drawings. Throughout the drawings, identical parts will be designated by like reference symbols.

First Embodiment

Substrate Processing Apparatus

Figure 1B:
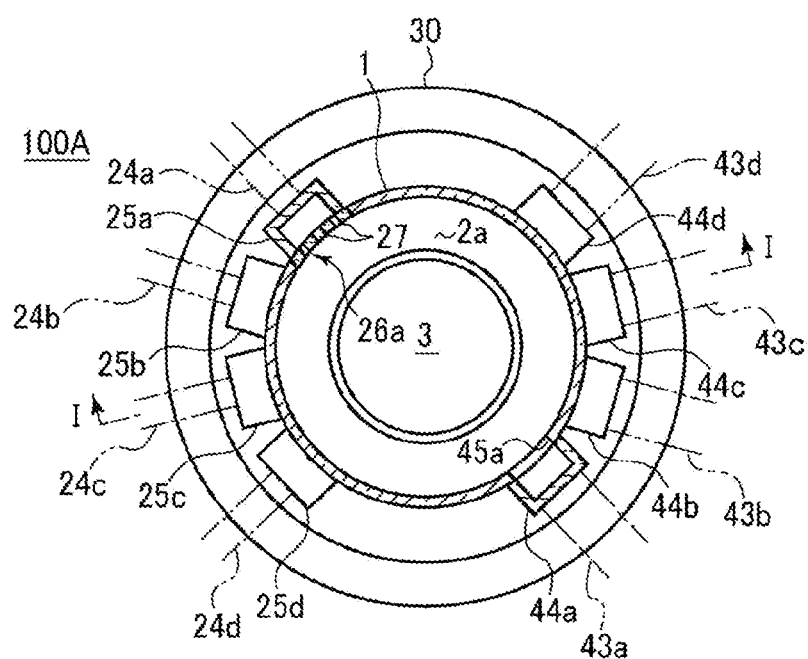
FIG. 1B is a horizontal sectional view showing a batch-type vertical substrate processing apparatus according to one example of a first embodiment.

FIG. 1A is a vertical sectional view showing a batch-type vertical substrate processing apparatus according to one example of a first embodiment of the present disclosure and FIG. 1B is a horizontal sectional view thereof. The cross section shown in FIG. 1A is a cross section taken along line I'-I' in FIG. 1B. The cross section shown in FIG. 1B is a cross section taken along line I-I shown in FIG. 1A.

As shown in FIGS. 1A and 1B, the batch-type vertical substrate processing apparatus 100A includes a cylindrical processing chamber 1, which is opened at a lower end thereof and roofed. The entire processing chamber 1 is made of, e.g., quartz. A plurality of flanges 2a to 2d is installed on an inner wall of the processing chamber 1. The flanges 2a to 2d are installed to protrude from the inner wall of the processing chamber 1 toward an internal space of the processing chamber 1 along a planar direction. Thus, the interior of the processing chamber 1 is divided by the flanges 2a to 2d into a plurality of processing subspaces Za to Zd along a height direction.

A substrate holder 3 is inserted into the processing chamber 1 from the opening of the lower end of the processing chamber 1. One example of the substrate holder 3 is a quartz-made wafer boat. The wafer boat holds a plurality of target substrates W, e.g., 50 to 100 target substrates to be processed, which are stacked in a height direction. One example of the target substrates W is semiconductor substrates. One example of the semiconductor substrates is silicon wafers.

Figure 2:
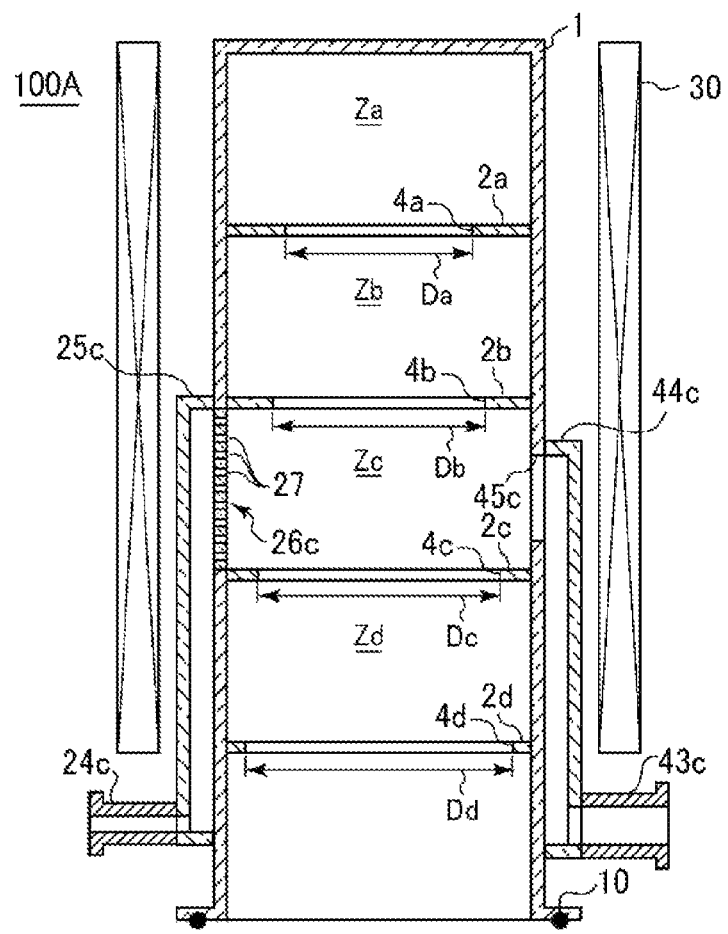
FIG. 2 is a vertical sectional view showing a state in which a substrate holder is removed from a batch-type vertical substrate processing apparatus according to one example of a first embodiment.

The respective flanges 2a to 2d include insertion holes 4a to 4d through which the substrate holder 3 is inserted. FIG. 2 is a vertical sectional view showing a state in which the substrate holder 3 is removed from the batch-type vertical substrate processing apparatus 100A. As shown in FIG. 2, the diameters Da to Dd of the insertion holes 4a to 4d are small at an upper side of the processing chamber 1 and become gradually larger toward a lower side of the processing chamber 1. The substrate holder 3 is inserted into the processing chamber 1 through the insertion holes 4a to 4d. Thus, the target substrates W can be accommodated within the processing chamber 1, and the processing such as film forming, oxidizing/nitriding, thermal processing, etching and the like can be performed on the target substrates W.

The substrate holder 3 is mounted on a table 6 through a quartz-made heat insulating tube 5. The table 6 is supported on a rotation shaft 7. The rotation shaft 7 passes through a cover portion 8 made of, e.g., stainless steel. For example, a magnetic fluid seal 9 is installed between the cover portion 8 and a through portion of the rotation shaft 7. Thus, the rotation shaft 7 rotatably passes through the cover portion 8 while maintaining a hermetically sealed state. The cover portion 8 opens and closes the lower end opening of the processing chamber 1. A seal member 10 formed with, e.g., an O-ring, is interposed between the periphery of the lower end opening of the processing chamber 1 and the periphery of the cover portion 8. Thus, the sealability of the interior of the processing chamber 1 is maintained. The rotation shaft 7 is attached to a tip end of an arm 11 supported by an elevating mechanism (not shown), e.g., a boat elevator or the like. Thus, the substrate holder 3 and the cover portion 8 are moved up and down together, and are inserted into and removed from the interior of the processing chamber 1.

The batch-type vertical substrate processing apparatus 100A includes a gas supply mechanism 20 which supplies a process gas into the processing subspaces Za to Zd divided in the processing chamber 1. The process gas is a gas used in processing the target substrates W. The gas supply mechanism 20 includes a process gas supply source 21. The process gas supply source 21 is connected to gas supply pipes 24a to 24d through flow rate controllers 22a to 22d (e.g., mass flow controller (MFC)) and on-off valves 23a to 23d. The gas supply pipes 24a to 24d are connected to gas supply paths 25a to 25d, which are installed to correspond to the respective processing subspaces Za to Zd.

A heating device 30 configured to heat the interior of the processing chamber 1 is installed outside the processing chamber 1. In one embodiment, the heating device 30 has a cylindrical shape and surrounds the periphery of the cylindrical processing chamber 1. In one embodiment, the gas supply paths 25a to 25d extend in the height direction and are connected to the processing subspaces Za to Zd, respectively, via a space defined between the heating device 30 and the outer wall of the processing chamber 1. Gas discharge plates 26a to 26d are installed between the gas supply paths 25a to 25d and the corresponding processing subspaces Za to Zd. A plurality of gas discharge holes 27 are formed in the gas discharge plates 26a to 26d. A process gas is discharged into the respective processing subspaces Za to Zd along the planar direction through the gas discharge holes 27. In respect of the gas discharge plates 26a to 26d, for the sake of convenience in illustration, the gas discharge plate 26a corresponding to the processing subspace Za is shown FIG. 1B and the gas discharge plate 26c corresponding to the processing subspace Zc is shown FIG. 1A.

In one embodiment, the gas supply mechanism 20 is configured to independently control supply amounts of the process gas with respect to the respective processing subspaces Za to Zd. That is to say, the supply amounts of the process gas supplied to the respective processing subspaces Za to Zd are independently controlled by the respective mass flow controllers 22a to 22d.

The batch-type vertical substrate processing apparatus 100A further includes a gas exhaust mechanism 40 configured to exhaust the process gas from the interior of the processing subspaces Za to Zd divided in the processing chamber 1. The gas exhaust mechanism 40 includes an exhaust device 41 such as a vacuum pump or the like. The exhaust device 41 is connected to gas exhaust pipes 43a to 43d through pressure controllers 42a to 42d. The gas exhaust pipes 43a to 43d are connected to gas exhaust paths 44a to 44d installed to correspond to the respective processing subspaces Za to Zd.

In one embodiment, the gas exhaust paths 44a to 44d extend in the height direction, and are connected to the respective processing subspaces Za to Zd through the space defined between the heating device 30 and the outer wall of the processing chamber 1. Gas exhaust ports 45a to 45d are formed between the gas exhaust paths 44a to 44d and the corresponding processing subspaces Za to Zd. The process gas supplied to the processing subspaces Za to Zd is exhausted through the gas exhaust ports 45a to 45d. With respect to the gas exhaust ports 45a to 45d, for the sake of convenience in illustration, the gas exhaust port 45a corresponding to the processing subspace Za is shown in FIG. 1B and the gas exhaust port 45c corresponding to the processing subspace Zc is shown in FIG. 1A.

In one embodiment, the gas exhaust mechanism 40 is configured to independently control exhaust amounts of the process gas with respect to the respective processing subspaces Za to Zd. That is to say, the exhaust amounts of the process gas exhausted from the respective processing subspaces Za to Zd are independently controlled by the respective pressure controllers 42a to 42d.

The respective parts of the batch-type vertical substrate processing apparatus 100A are controlled by a control unit 50. The control unit 50 includes a process controller 51 constituted with, e.g., a microprocessor (computer). The process controller 51 is coupled to a user interface 52 including a touch panel through which an operator performs an input operation of a command to manage the batch-type vertical substrate processing apparatus 100A, a display which visually displays an operating status of the batch-type vertical substrate processing apparatus 100A and the like.

The process controller 51 is coupled to a storage unit 53. The storage unit 53 stores a control program for implementing, under the control of the process controller 51, various kinds of processing performed by the batch-type vertical substrate processing apparatus, and a program for causing respective constituent parts of the batch-type vertical substrate processing apparatus 100A to perform processing according to process conditions, namely, a so-called process recipe. The process recipe is stored in, e.g., a storage medium of the storage unit 53. The storage medium may be a hard disc or a semiconductor memory, or may be a portable storage medium such as a CD-ROM, a DVD, a flash memory or the like. Alternatively, a process recipe may be appropriately transmitted from another device through, e.g., a dedicated line. If necessary, the process recipe is read out from the storage unit 53 in response to an instruction inputted from the user interface 52. The process controller 51 performs processing according to the read-out process recipe. Thus, the batch-type vertical substrate processing apparatus 100A performs designated processing under the control of the process controller 51.

<Substrate Holder>

Next, description will be made on the substrate holder 3 that can be suitably used in the batch-type vertical substrate processing apparatus 100A.

FIG. 3A is a vertical sectional view showing an illustrative embodiment of the substrate holder used in the batch-type vertical substrate processing apparatus according to one example of the first embodiment, and FIG. 3B is a perspective view thereof.

As shown in FIGS. 3A and 3B, the substrate holder 3 includes a plurality of pillars 61. A plurality of support grooves 62 is formed in the pillars 61. The target substrates W are supported by the support grooves 62, thereby being held in the substrate holder 3. A top plate 63 is installed on top portions of the pillars 61. In the perspective view of FIG. 3B, the support grooves 62 are not shown.

In one embodiment, the substrate holder 3 includes a plurality of division plates 65a to 65d which divide a holding part for holding the target substrates W staked in the height direction into a plurality of processing subspace holding parts 64a to 64d corresponding to the processing subspaces along the height direction. The division plates 65a to 65d are installed to correspond to the respective flanges 2a to 2d of the batch-type vertical substrate processing apparatus 100A.

In one embodiment, the substrate holder 3 is configured such that diameters Øa to Ød of the division plates 65a to 65d are small at an upper side of the substrate holder 3 and become gradually larger toward a lower side of the substrate holder 3. The division plate having the smallest diameter is the division plate 65a which divides the processing sub holding part 64a corresponding to the processing subspace Za. The top plate 63 is disposed above the division plate 65a. The diameter Ø of the top plate 63 is set smaller than the diameter Øa of the division plate 65a.

In one embodiment, clearance portions are set between upper surfaces of the division plates 65a to 65d provided to the substrate holder 3 and the lower surfaces of the flanges 2a to 2d.

<Clearance Portion>

Next, the clearance portions of the batch-type vertical substrate processing apparatus according to the first embodiment will be described as compared with a comparative example.

Comparative Example

Figure 4A:
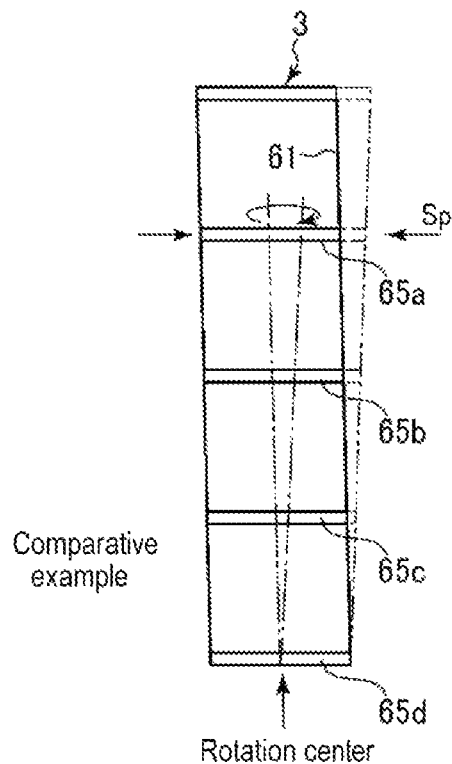
FIGS. 4A to 4C are views showing a comparative example, FIG. 4A being a view schematically showing a state in which an "amplitude" is generated in a substrate holder by a precession movement of a substrate holder, FIG. 4B being a view schematically showing a state in which an "amplitude" is generated in the substrate holder by rotation of the substrate holder, and FIG. 4C being a vertical sectional view showing a clearance portion set in a batch-type vertical substrate processing apparatus according to a comparative example.
Figure 4B:
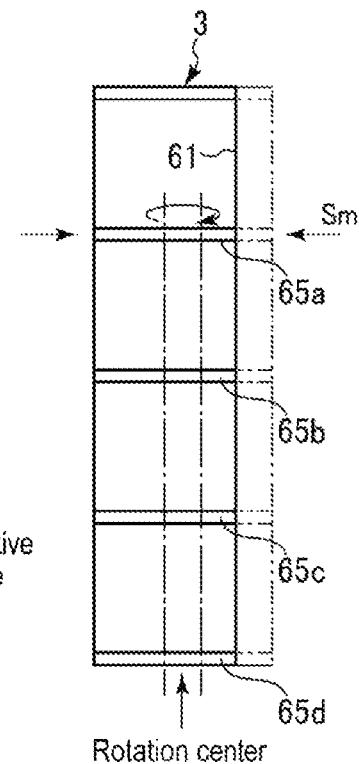
Figure 4C:
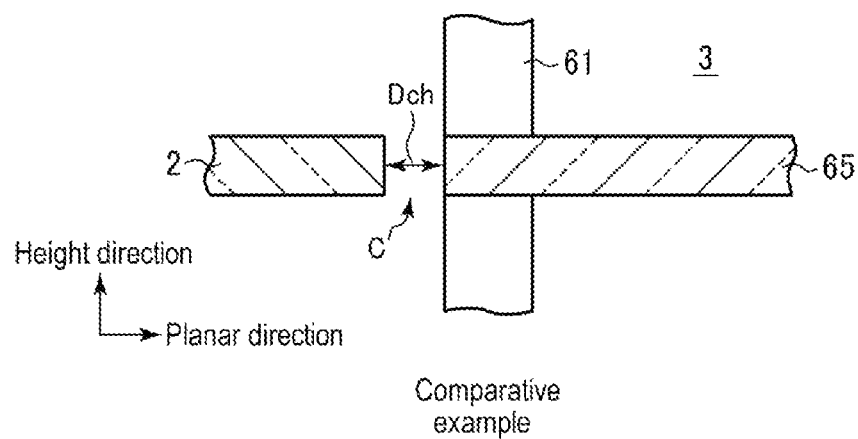

FIGS. 4A to 4C are views showing a comparative example. FIG. 4A is a view schematically showing a state in which an "amplitude" is generated in the substrate holder by precession movement of the substrate holder, FIG. 4B is a view schematically showing a state in which an "amplitude" is generated in the substrate holder by rotation of the substrate holder, and FIG. 4C is a vertical sectional view showing a clearance portion set in a batch-type vertical substrate processing apparatus according to a comparative example.

As shown in FIG. 4A, if the substrate holder 3 has a perpendicularity error within an allowable range, the substrate holder 3 is inclined. Upon rotating the inclined substrate holder 3, the substrate holder 3 makes precession movement. By virtue of the precession movement, an "amplitude Sp" is generated in the substrate holder 3.

As shown in FIG. 4B, it is assumed that, when mounted on a heat insulating tube not shown, the substrate holder 3 is deviated from a rotation center within an allowable range. In this case, upon rotating the deviated substrate holder 3, the substrate holder 3 rotates about the rotation center. By virtue of this rotation, an "amplitude Sm" is generated in the substrate holder 3.

As shown in FIG. 4C, when setting a clearance portion C between a side surface portion of the flange 2 extending in a height direction and a side surface portion of the division plate 65 extending in a height direction, a distance Dch of the clearance portion C extending in a planar direction is set to a dimension that the side surface portions do not make contact with each other, by predicting the "amplitude Sp+amplitude Sm". If a substrate holder 3 is capable of holding 100 target substrates W, the distance Dch needs to be about 10 mm.

However, if the distance Dch is set to be equal to 10 mm, the conductance of the clearance portion C becomes higher and the sealability between the processing subspaces deteriorates. Thus, leakage of a process gas from one processing subspace to another processing subspace or vice versa will easily occur. For example, if the gas leakage easily occurs, it is difficult to accurately control the concentration, the flow rate or the like of a process gas with respect to the respective processing subspaces. If it is difficult to perform accurate control, it becomes difficult to form, e.g., a thin film with increased target substrate in-plane and inter-plane uniformity of thickness.

First Embodiment

Figure 5:
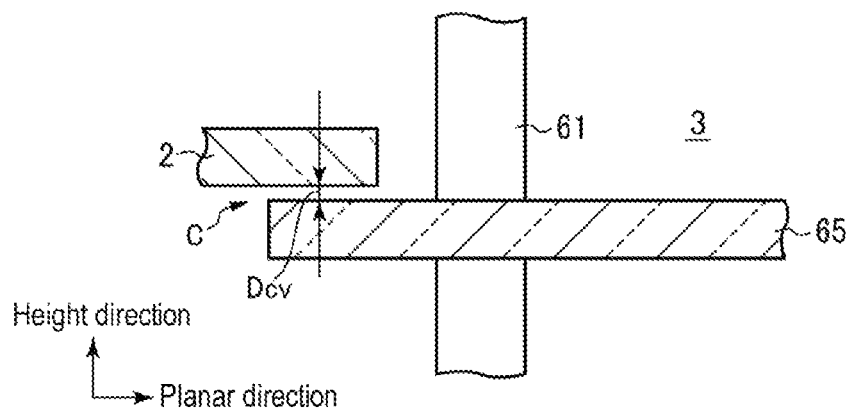
FIG. 5 is a vertical sectional view showing a clearance portion set in the batch-type vertical substrate processing apparatus according one example of a first embodiment.

FIG. 5 is a vertical sectional view showing a clearance portion set in the batch-type vertical substrate processing apparatus according one example of the first embodiment.

As shown in FIG. 5, as compared with the aforementioned comparative example, the clearance portion C of the batch-type vertical substrate processing apparatus according one example of the first embodiment is set between the lower surface of the flange 2 extending in a planar direction and the upper surface of the division plate 65 extending in a planar direction. Thus, the side surface portion of the division plate 65 extending in a height direction can freely move in a planar direction at the lower side of the lower surface of the flange 2.

Therefore, even if the substrate holder 3 makes a precession movement as shown in FIG. 4A and even if the substrate holder 3 rotates about the rotation center as shown in FIG. 4B, the side surface portion of the division plate 65 extending in the height direction does not make contact with the flange 2. As mentioned above, in the first embodiment, since the clearance portion C can be set to be changed from the planar direction to the height direction, the distance Dcv of the clearance portion C extending in the height direction need not be set to the "amplitude Sp+amplitude Sm".

Accordingly, the distance Dcv of the clearance portion C extending in the height direction can be set to become smaller than that of the comparative example. For example, in a substrate holder 3 capable of holding 100 target substrates W, it is possible to close the distance Dcv up to 3 to 5 mm. However, the distance between the pillars 61 and the side surface portion of the flange 2 extending in the height direction needs to set the "amplitude Sp+amplitude Sm" such that the pillars 61 should not make contact with the side surface portion of the flange 2.

As described above, since the distance Dcv extending in the height direction can be set smaller than the distance Dch extending in the planar direction, it is possible to reduce the conductance of the clearance portion C. Thus, the sealability between the processing subspaces can be kept high and the leakage of a process gas from one processing subspace to another processing subspace or vice versa can be suppressed. Since the sealability can be kept high as mentioned above, it is possible to accurately control, e.g., the concentration, the flow rate or the like of a process gas with respect to the respective processing subspaces. Further, it becomes possible to form, e.g., a thin film with increased target substrate in-plane and inter-plane uniformity of thickness.

According to the first embodiment described above, even if a height of the substrate holder 3 becomes taller, it is possible to provide a batch-type vertical substrate processing apparatus which can suppress deterioration of the sealability of the processing subspaces and a substrate holder which can be suitably used in the batch-type vertical substrate processing apparatus.

<Examples of the Clearance Portion>

Next, description will be made on examples of the clearance portion C. In the batch-type vertical substrate processing apparatus according to one example of the first embodiment, the clearance portion C is set to extend in a straight line along the planar direction by allowing the lower surface of the flange 2 extending in the planar direction and the upper surface of the division plate 65 extending in the planar direction to face each other. However, the clearance portion C may not be limited to the one extending in a straight line along the planar direction. For example, the clearance portion C may employ a so-called "labyrinth structure" which combines a region extending in the planar direction and a region extending in the height direction. If the clearance portion C employs the labyrinth structure, it is possible to further reduce the conductance of the clearance portion C. Certain examples of the labyrinth structure will be described below.

Labyrinth Structure

First Example

Figure 6A:
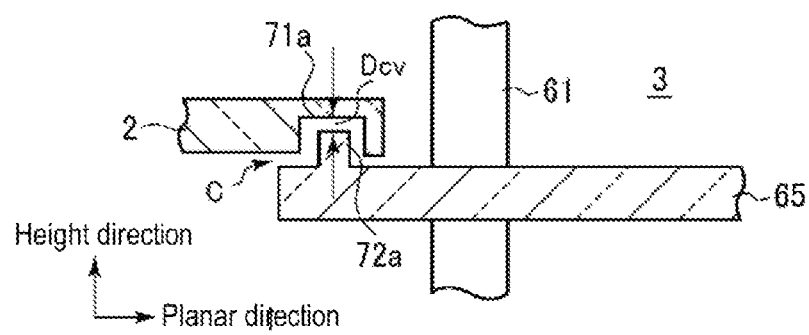
FIG. 6A is a vertical sectional view showing a first example of a labyrinth structure.

FIG. 6A is a vertical sectional view showing a first example of a labyrinth structure. The labyrinth structure shown in FIG. 6A includes a concave portion 71a annularly formed on the lower surface of the flange 2 and a convex portion 72a annularly formed on the upper surface of the division plate 65. The concave portion 71a is fitted to the convex portion 72a in a contactless state.

Labyrinth Structure

Second Example

Figure 6B:
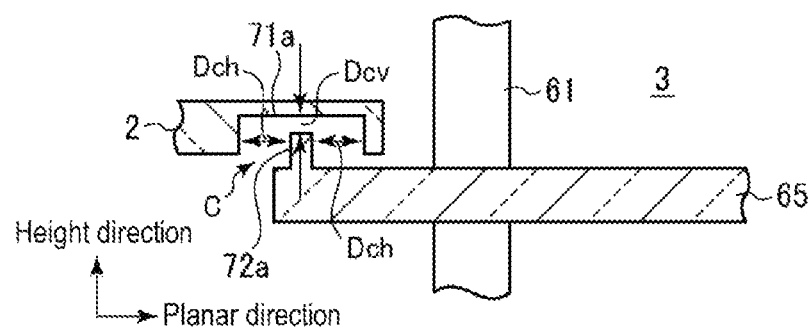
FIG. 6B is a vertical sectional view showing a second example of a labyrinth structure.

FIG. 6B is a vertical sectional view showing a second example of a labyrinth structure. If the labyrinth structure is adopted at the clearance portion C, places are generated where the side surface portions of the convex portion 72a extending in the height direction and the side surface portions of the concave portion 71a extending in the height direction face each other. It is needed to predict "amplitude Sp+amplitude Sm" at these places such that the mutually-facing side surface portions should not make contact with each other. More specifically, it is needed to set the distance Dch extending in the planar direction to be equal to the distance Dch described above with reference to the comparative example. That is to say, the labyrinth structure shown in FIG. 6B is directed to an example of increasing the distance Dch of the labyrinth structure shown in FIG. 6A between the side surface portion of the convex portion 72a extending in the height direction and the side surface portion of the concave portion 71a extending in the height direction by predicting the "amplitude Sp+amplitude Sm".

As mentioned above, if places are generated where the side surface portions of the convex portion 72a extending in the height direction and the side surface portions of the concave portion 71a extending in the height direction face each other, the distance Dch between the side surface portions may be increased by predicting the "amplitude Sp+amplitude Sm." Even if the distance Dch is increased, the portion having a distance Dcv smaller than the distance Dch is left in the labyrinth structure. This makes it possible to suppress occurrence of a situation where the conductance becomes larger. This is applied to all labyrinth structures to be described later in the same manner. The "amplitude Sp+amplitude Sm" can be predicted by the distance Dch.

Labyrinth Structure

Third Example

Figure 6C:
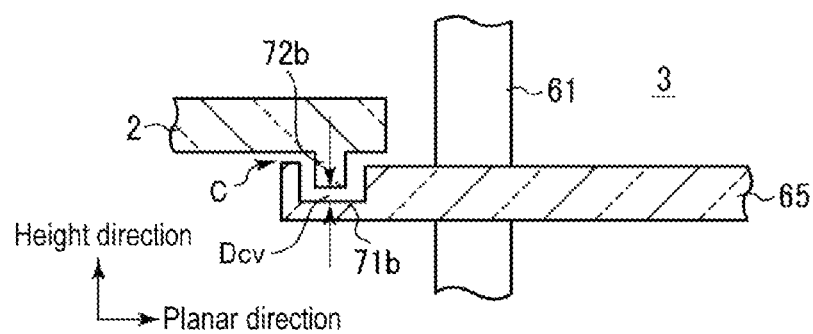
FIG. 6C is a vertical sectional view showing a third example of a labyrinth structure.

FIG. 6C is a vertical sectional view showing a third example of a labyrinth structure. Contrary to the first example, the labyrinth structure shown in FIG. 6C includes a convex portion 72b annularly formed on the lower surface of the flange 2 and a concave portion 71b annularly formed on the upper surface of the division plate 65. As with the first example, the concave portion 71b is fitted to the convex portion 72b in a contactless state. As such, when the concave portion 71b is formed in the division plate 65 as mentioned above, the convex portion 72b may be formed in the flange 2.

Labyrinth Structure

Fourth Example

Figure 6D:
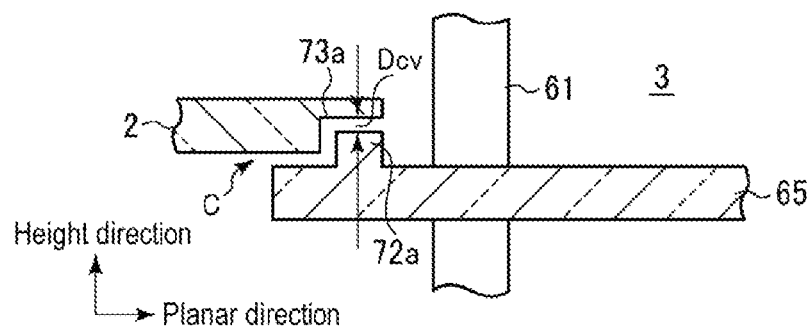
FIG. 6D is a vertical sectional view showing a fourth example of a labyrinth structure.

FIG. 6D is a vertical sectional view showing a fourth example of a labyrinth structure. As with the first example, the labyrinth structure shown in FIG. 6D includes a convex portion 72a formed on the upper surface of the division plate 65. The labyrinth structure shown in FIG. 6D differs from the first example in that a cutout portion 73a is formed on the lower surface of the side surface portion of the flange 2 by annularly cutting the side surface portion of the flange 2.

The convex portion 72a formed on the upper surface of the division plate 65 is fitted to the cutout portion 73a formed in the side surface portion of the flange 2 in a contactless state. In this way, the concave portion may be changed to the cutout portion 73a.

Labyrinth Structure

Fifth Example

Figure 6E:
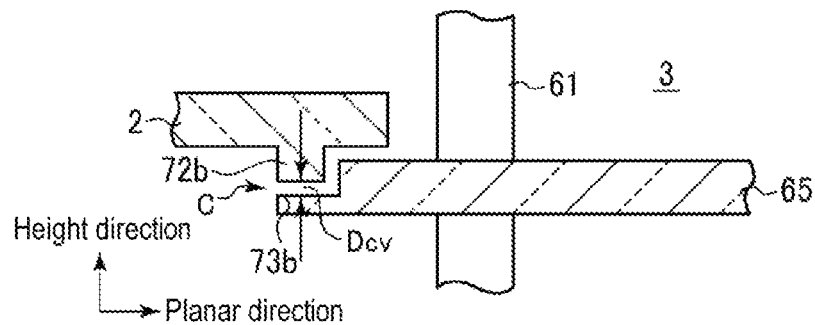
FIG. 6E is a vertical sectional view showing a fifth example of a labyrinth structure.

FIG. 6E is a vertical sectional view showing a fifth example of a labyrinth structure. Contrary to the fourth example, the labyrinth structure shown in FIG. 6E includes a cutout portion 73b formed in the side surface portion of the division plate 65 and a convex portion 72b formed on the lower surface of the flange 2. As such, when the cutout portion 73b is formed in the division plate 65 as mentioned above, the convex portion 72b may be formed in the flange 2.

Labyrinth Structure

Sixth Example

Figure 6F:
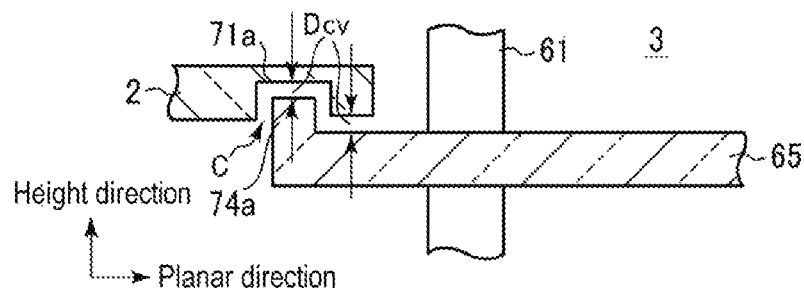
FIG. 6F is a vertical sectional view showing a sixth example of a labyrinth structure.

FIG. 6F is a vertical sectional view showing a sixth example of a labyrinth structure. The labyrinth structure shown in FIG. 6F is directed to an example where the side surface portion of the division plate 65 extending in the height direction is formed into a key-shaped portion 74a protruding toward the lower surface of the flange 2. A concave portion 71a to which the key-shaped portion 74a is fitted in a contactless state is formed on the low of the flange 2.

In this way, as for the convex portion, the side surface portion of the division plate 65 extending in the height direction can be formed into the key-shaped portion 74a.

Labyrinth Structure

Seventh Example

Figure 6G:
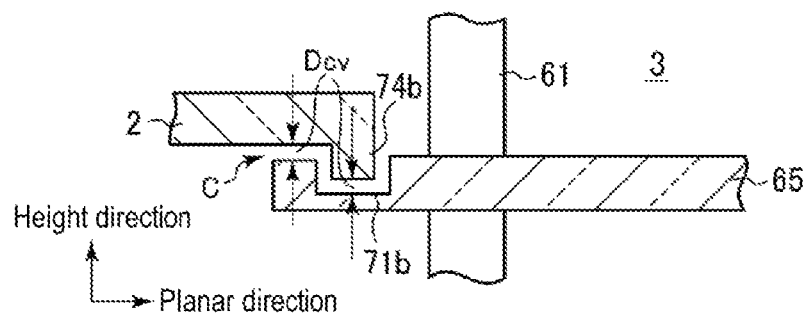
FIG. 6G is a vertical sectional view showing a seventh example of a labyrinth structure.

FIG. 6G is a vertical sectional view showing a seventh example of a labyrinth structure. Contrary to the sixth example, the labyrinth structure shown in FIG. 6G is directed to an example where the side surface portion of the flange 2 extending in the height direction is formed into a key-shaped portion 74b protruding toward the upper surface of the division plate 65. A concave portion 71b to which the key-shaped portion 74b is fitted in a contactless state is formed on the upper surface of the division plate 65. When the key-shaped portion 74b is formed in the side surface portion of the flange 2 extending in the height direction as mentioned above, the concave portion 71b may be formed in the division plate 65.

Labyrinth Structure

Eighth Example

Figure 6H:
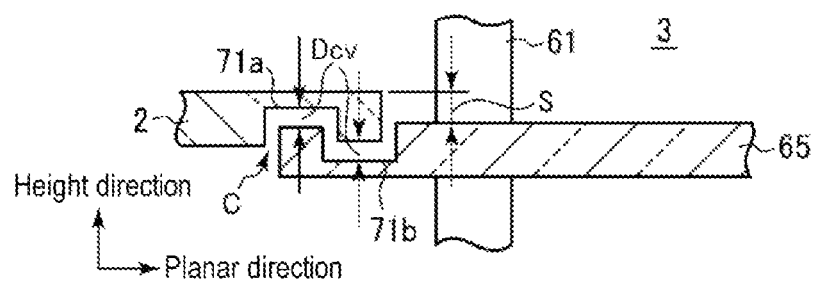
FIG. 6H is a vertical sectional view showing an eighth example of a labyrinth structure.

FIG. 6H is a vertical sectional view showing an eighth example of a labyrinth structure. The labyrinth structure shown in FIG. 6H is directed to an example where concave portions 71a and 71b are respectively formed on the lower surface of the flange 2 and the upper surface of the division plate 65. In this example, the portion existing between the concave portion 71a and the side surface portion of the flange 2 constitutes a convex portion. Similarly, the portion existing between the concave portion 71b and the side surface portion of the division plate 65 constitutes a convex portion. Thus, the flange 2 and the division plate 65 mesh with each other in a contactless state.

In the eighth example, the flange 2 and the division plate 65 mesh with each other in a contactless state. Therefore, as compared with the first to seventh examples, it is possible to reduce a step difference S generated between the upper surface of the flange 2 and the upper surface of the division plate 65. The reduction in the step difference S makes it possible to reduce the height direction dimension of the processing apparatus and to reduce the manufacturing cost of the processing apparatus. When the height direction dimension of the processing apparatus is not changed, it is possible to increase the height direction dimension of the processing subspaces. This makes it possible to obtain an advantage in that the number of processed target substrates can be increased.

Labyrinth Structure

Ninth Example

Figure 6I:
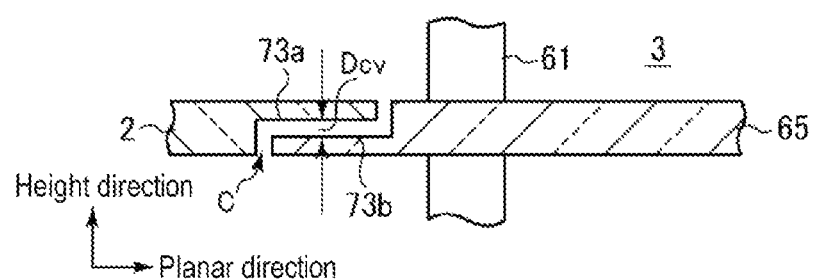
FIG. 6I is a vertical sectional view showing a ninth example of a labyrinth structure.

FIG. 6I is a vertical sectional view showing a ninth example of a labyrinth structure. The labyrinth structure shown in FIG. 6I is directed to an example where a cutout portion 73a as a concave portion facing toward the division plate 65 is formed in the side surface portion of the flange 2 extending in the height direction and a cutout portion 73b as a concave portion facing toward the flange 2 is formed in the side surface portion of the division plate 65 extending in the height direction. In this example, the cutout portion 73a of the flange 2 and the cutout portion 73b of the division plate 65 mesh with each other in a contactless state.

In the ninth example, it is possible to nearly eliminate a step difference generated between the upper surface of the flange 2 and the upper surface of the division plate 65 and a step difference generated between the lower surface of the flange 2 and the lower surface of the division plate 65. Therefore, in the ninth example, it is possible to obtain the same advantage as obtained in the eighth example. Since the flange 2 and the division plate 65 are coplanar with each other, it is possible to further obtain an advantage in that the flow of a process gas within the processing subspaces can be prevented from becoming turbulent due to a step difference.

Labyrinth Structure

Tenth Example

Figure 6J:
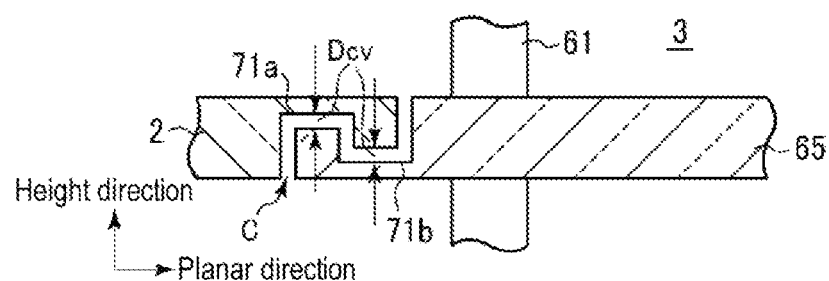
FIG. 6J is a vertical sectional view showing a tenth example of a labyrinth structure.

FIG. 6J is a vertical sectional view showing a tenth example of a labyrinth structure. The labyrinth structure shown in FIG. 6J is similar to the structure of the eighth example; however it is directed to an example where the lower surface of the flange 2 is flush with the lower surface of the division plate 65 and where the upper surface of the flange 2 is flush with the upper surface of the division plate 65.

In the tenth example, the flange 2 and the division plate 65 are coplanar with each other. It is therefore possible to obtain the same advantage as obtained in the ninth example. Furthermore, unlike the ninth example, a region where a convex portion and a concave portion are fitted to each other in a contactless state is defined within the clearance portion. It is therefore possible to obtain an advantage in that it is difficult for a process gas to flow through the clearance portion.

<Substrate Holding Examples>

Next, a description will be made on substrate holding examples in the processing compartment holding parts.

First Example

Figure 7A:
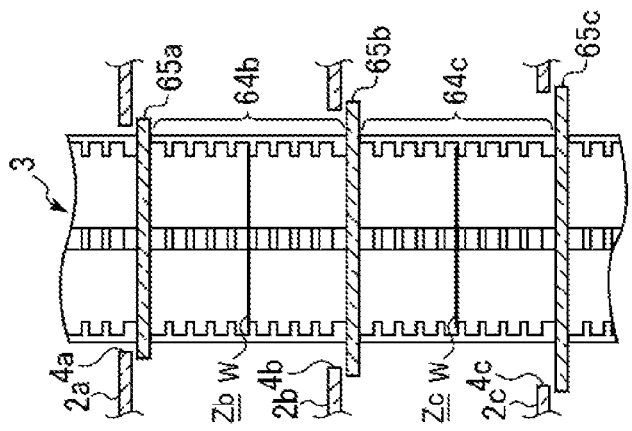
FIG. 7A is a vertical sectional view showing a first example of holding substrates.

FIG. 7A is a vertical sectional view showing a first example of holding substrates. In FIG. 7A, there are shown the processing subspace holding parts 64b and 64c and the processing subspaces Zb and Zc.

As shown in FIG. 7A, the target substrates W may be stacked and held in the height direction without a space therebetween in the processing subspace holding parts 64 (64b and 64c) of the substrate holder 3 and then the processing upon the target substrate W is performed.

Second Example

Figure 7B:
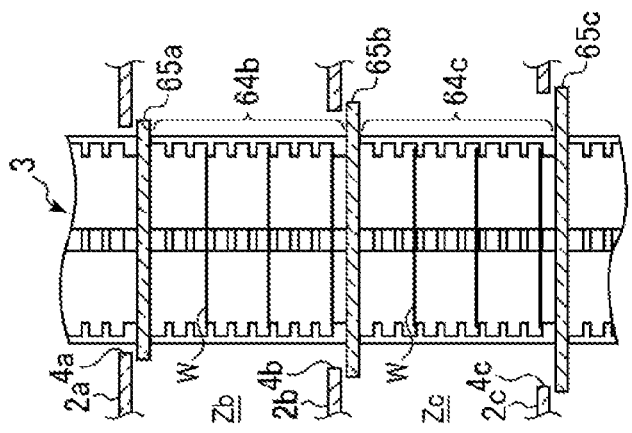
FIG. 7B is a vertical sectional view showing a second example of holding substrates.

FIG. 7B is a vertical sectional view showing a second example of holding substrates. In FIG. 7B, there are shown the processing subspace holding parts 64b and 64c and the processing subspaces Zb and Zc.

As shown in FIG. 7B, the target substrates W may be stacked and held in height direction with a space of one or more stages therebetween to be processed in the processing subspace holding parts 64 (64b and 64c) of the substrate holder 3. FIG. 7B shows an example where the target substrates W are stacked and held along the height direction while leaving a space of two stages.

Third Example

Figure 7C:
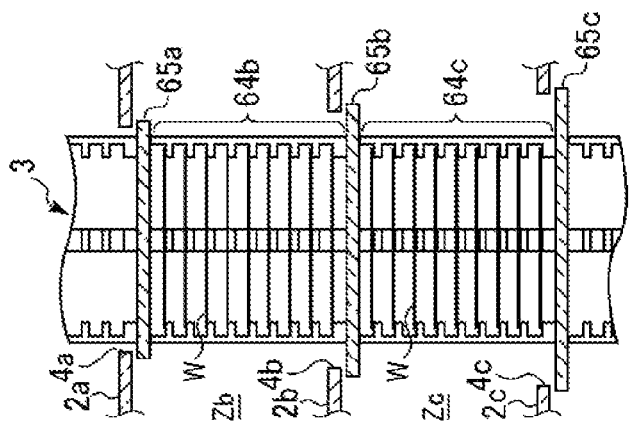
FIG. 7C is a vertical sectional view showing a third example of holding substrates.

FIG. 7C is a vertical sectional view showing a third example of holding substrates. In FIG. 7C, there are shown the processing subspace holding parts 64b and 64c and the processing subspaces Zb and Zc.

As shown in FIG. 7C, only one target substrate W is held to be processed in each of the processing subspace holding parts 64 (64b and 64c) of the substrate holder 3.

As illustrated in the first to third examples, one or more target substrates W may be stacked and held in each of the processing subspace holding parts 64 of the substrate holder 3 and may be processed in each of the processing subspaces Z. That is to say, the number of the target substrates W held in each of the processing compartment holding parts 64 may be arbitrarily determined.

First Embodiment

First Modified Example

Next, description will be made on a first modified example of the first embodiment. The first modified example may be applied to a second modified example and second to fourth embodiments, which will be described later.

<Substrate Processing Apparatus>

Figure 8A:
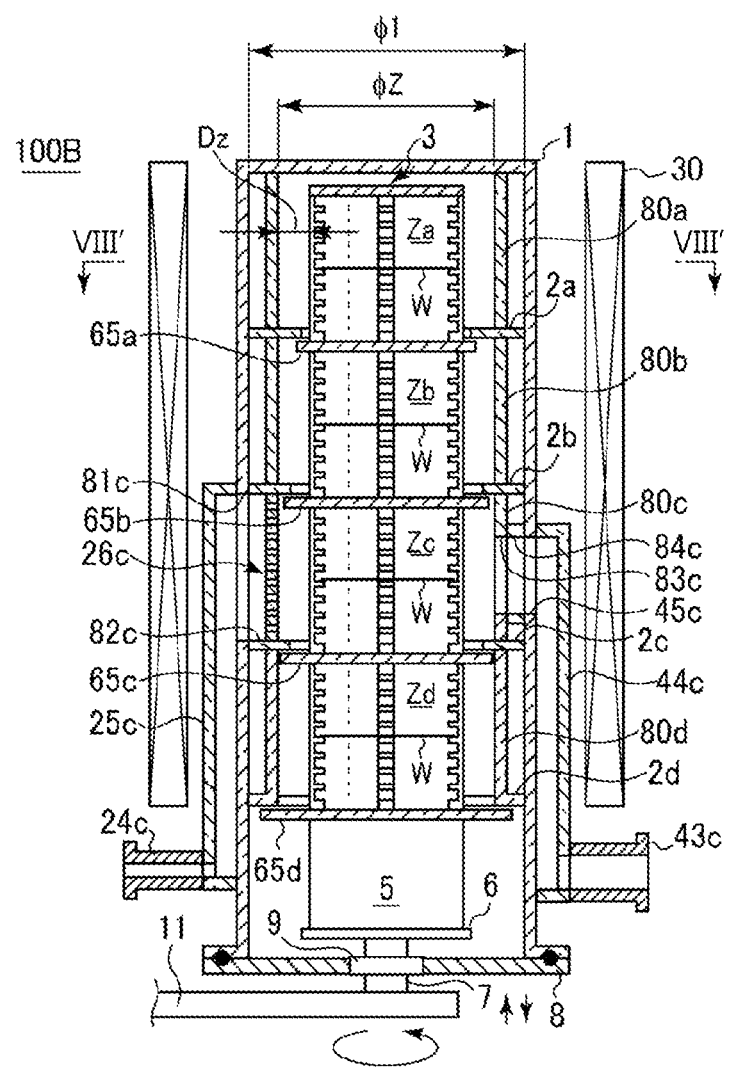
FIG. 8A is a vertical sectional view showing a batch-type vertical substrate processing apparatus according to a first modified example of a first embodiment.
Figure 8B:
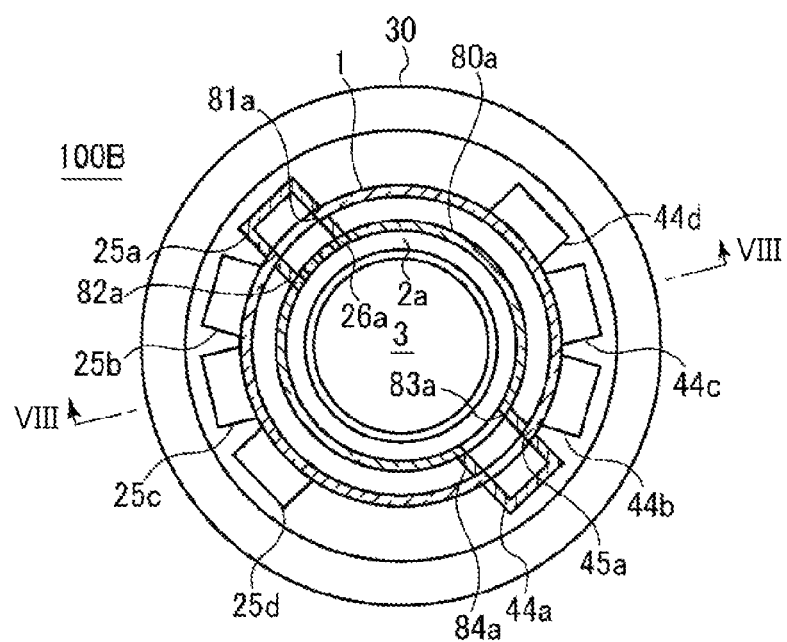
FIG. 8B is a horizontal sectional view showing a batch-type vertical substrate processing apparatus according to the first modified example of a first embodiment.

FIG. 8A is a vertical sectional view showing a batch-type vertical substrate processing apparatus according to a first modified example of the first embodiment. FIG. 8B is a horizontal sectional view thereof. The cross section shown in FIG. 8A is a cross section taken along line VIII-VIII in FIG. 8B. The cross section shown in FIG. 8B is a cross section taken along line VIII'-VIII' in FIG. 8A.

As shown in FIGS. 8A and 8B, the batch-type vertical substrate processing apparatus 100B according to the first modified example differs from the batch-type vertical substrate processing apparatus 100A described above with reference to FIGS. 1A and 1B, in that the substrate processing apparatus 100B further includes partition walls 80a to 80d disposed along the inner wall of the processing chamber 1 between the flange 2a and the top portion of the processing chamber 1 and between the flanges 2a to 2d to divide the processing chamber 1 such that the inner diameter ØZ of the processing subspaces Za to Zd becomes smaller than the inner diameter Ø1 of the processing chamber 1.

Gas discharge plates 26a to 26d for discharging a process gas therethrough are installed in the respective partition walls 80a to 80d. The gas discharge plates 26a to 26d are connected to gas supply paths 25a to 25d through openings 81a to 81d formed in the wall of the processing chamber 1 and through gas guide paths 82a to 82d which interconnect the openings 81a to 81d and the gas discharge plates 26a to 26d. With respect to the gas discharge plates 26a to 26d, the openings 81a to 81d and the gas guide paths 82a to 82d, for the sake of convenience in illustration, the gas discharge plate 26a, the opening 81a and the gas guide path 82a corresponding to the processing subspace Za are shown in FIG. 8B, and the gas discharge plate 26c, the opening 81c and the gas guide path 82c corresponding to the processing subspace Zc are shown in FIG. 8A.

Openings 83a to 83d for exhausting a process gas therethrough are formed in the respective partition walls 80a to 80d. The openings 83a to 83d are connected to gas exhaust paths 44a to 44d through gas exhaust ports 45a to 45d and through gas guide paths 84a to 84d which interconnect the gas exhaust paths 44a to 44d and the openings 83a to 83d. With respect to the gas exhaust ports 45a to 45d, the openings 83a to 83d and the gas guide paths 84a to 84d, for the sake of convenience in illustration, the gas exhaust port 45a, the opening 83a and the gas guide path 84a corresponding to the processing subspace Za are shown in FIG. 8B. The gas exhaust port 45c, the opening 83c and the gas guide path 84c corresponding to the processing subspace Zc are shown in FIG. 8A.

According to the first modified example, the diameter ØZ of the processing subspaces Za to Zd is made smaller than that of the first embodiment by the partition walls 80a to 80d. Thus, for example, the distance $D_Z$ from the outer peripheral end portions of the target substrates W to the inner walls of the processing subspaces Za to Zd becomes smaller. The reduction in the distance DZ leads to a decrease in the conductance of the spaces defined from the outer peripheral end portions of the target substrates W to the inner walls of the processing subspaces Za to Zd. Therefore, as compared with the first embodiment, it is possible to reduce the amount of a process gas passing through the region over the distance DZ, so that there is an advantage in that a large amount of process gas can be easily supplied onto the processing target surfaces of the target substrates W held by the substrate holder 3. If a large amount of process gas flows onto the processing target surfaces of the target substrates W, it is possible to increase the processing speed and to enhance the target substrate in-plane and inter-plane processing uniformity.

<Substrate Holding Example>

As described above, if a large amount of process gas flows onto the processing target surfaces of the target substrates W, it is possible to increase the processing speed and to enhance the target substrate in-plane and inter-plane processing uniformity.

Next, description will be made on an example of holding substrates which enables a large amount of process gas to flow onto the processing target surfaces of the target substrates W.

FIG. 9 is a vertical sectional view showing an example of holding substrates in the batch-type vertical substrate processing apparatus according to the first modified example.

As shown in FIG. 9, when the target substrates W are held in the processing subspace holding parts 64 (64c and 64d) of the substrate holder 3, a holding pitch Pw of the target substrates W is set larger than the distance DZ. By doing so, for example, the conductance of the region between the target substrates W can be made larger than the conductance of the region of the distance DZ.

Therefore, if the holding pitch Pw of the target substrates W is set larger than the distance DZ, a large amount of process gas can flow onto the processing target surfaces of the target substrates W, so that there is an advantage in that it is possible to increase the processing speed and to enhance the target substrate in-plane and inter-plane processing uniformity.

<Substrate Holder>

Figure 10:
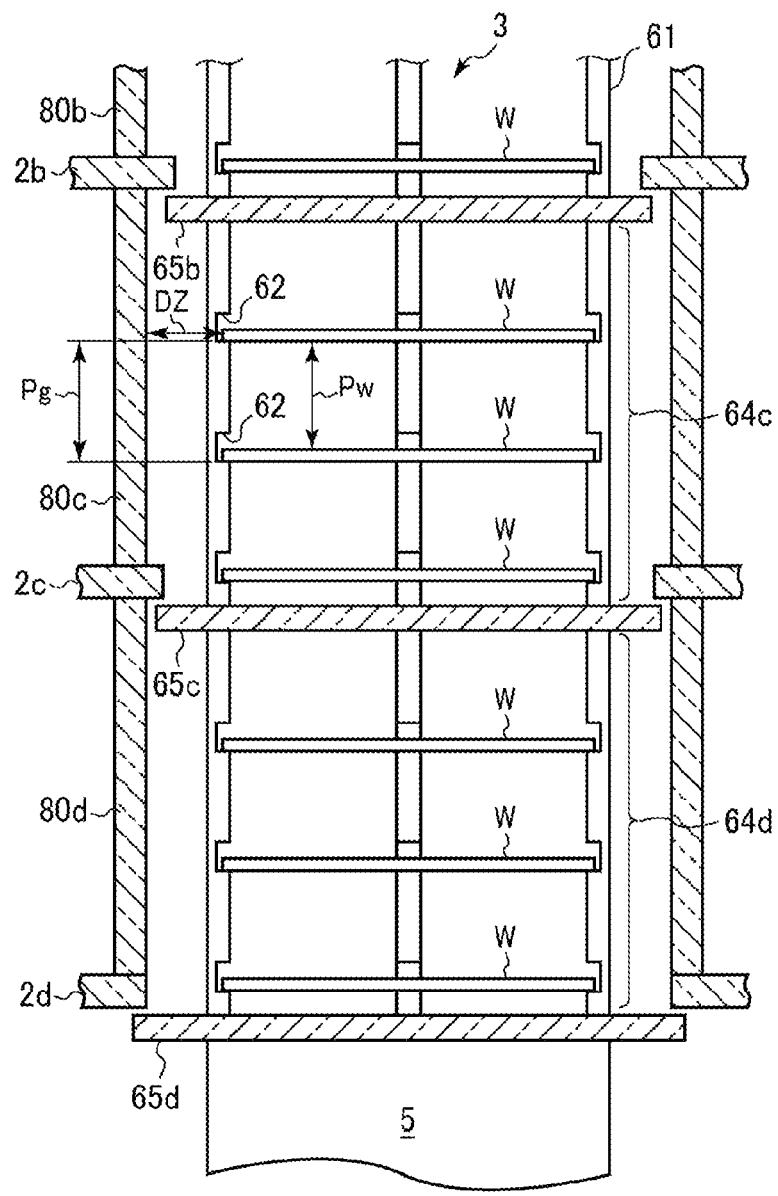
FIG. 10 is a vertical sectional view showing one example of a substrate holder used in a batch-type vertical substrate processing apparatus according to a first modified example of a first embodiment.

Next, description will be made on one example of the substrate holder which is designed to obtain the aforementioned advantages. FIG. 10 is a vertical sectional view showing one example of the substrate holder used in the batch-type vertical substrate processing apparatus according to the first modified example.

As shown in FIG. 10, a formation pitch Pg of the support grooves 62 formed in the pillars 61 of the substrate holder 3 is set larger than the distance DZ. In this case, if the target substrates W are merely supported in the support grooves 62, the holding pitch Pw of the target substrates W becomes larger than the distance DZ.

By setting the formation pitch Pg of the support grooves 62 to become larger than the distance DZ as mentioned above, a large amount of process gas can flow onto the processing target surfaces of the target substrates W, so that there is an advantage in that it is possible to increase the processing speed and to enhance the target substrate in-plane and inter-plane processing uniformity.

First Embodiment

Second Modified Example

Next, a description will be made of a second modified example of the first embodiment. The second modified example may be applied to the second to fourth embodiments, which will be described later.

<Substrate Processing Apparatus>

Figure 11:
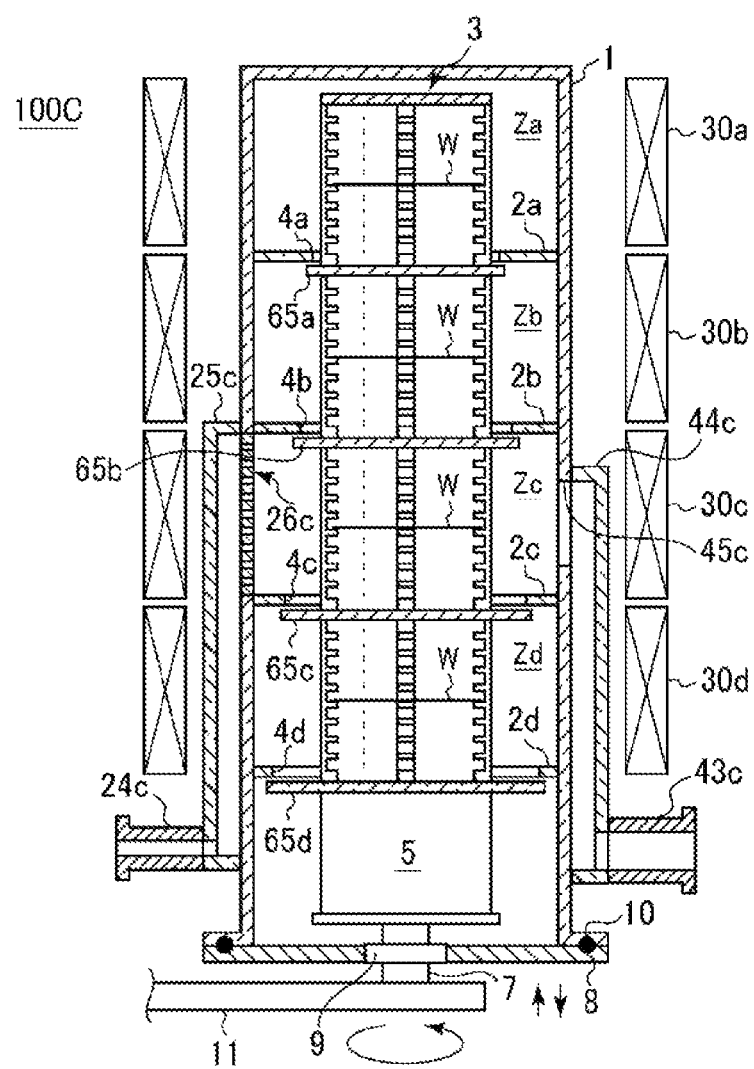
FIG. 11 is a vertical sectional view showing a batch-type vertical substrate processing apparatus according to a second modified example of a first embodiment.

FIG. 11 is a vertical sectional view showing a batch-type vertical substrate processing apparatus according to a second modified example of the first embodiment.

As shown in FIG. 11, the batch-type vertical substrate processing apparatus 100C according to the second modified example differs from the batch-type vertical substrate processing apparatus 100A described above with reference to FIGS. 1A and 1B, in that the heating device 30, which was common to the processing subspaces Za to Zd, is divided into heating devices 30a to 30d corresponding to the respective processing subspaces Za to Zd so as to heat the respective processing subspaces Za to Zd.

As the heating device 30 is divided into the heating devices 30a to 30d and the heating devices 30a to 30d are installed on the respective processing subspaces Za to Zd as in the second modified example, it becomes possible not only to independently control the process gas supply amount and the processing pressure with respect to the respective processing subspaces Za to Zd but also to independently control the processing temperature with respect to the respective processing subspaces Za to Zd.

Therefore, according to the second modified example, it is possible to obtain an advantage in that, as compared with one example of the first embodiment, the target substrate in-plane and inter-plane processing uniformity can be further enhanced.

Second Embodiment

Next, a description will be made of a second embodiment of the present disclosure.

<Substrate Processing Apparatus>

Figure 12A:
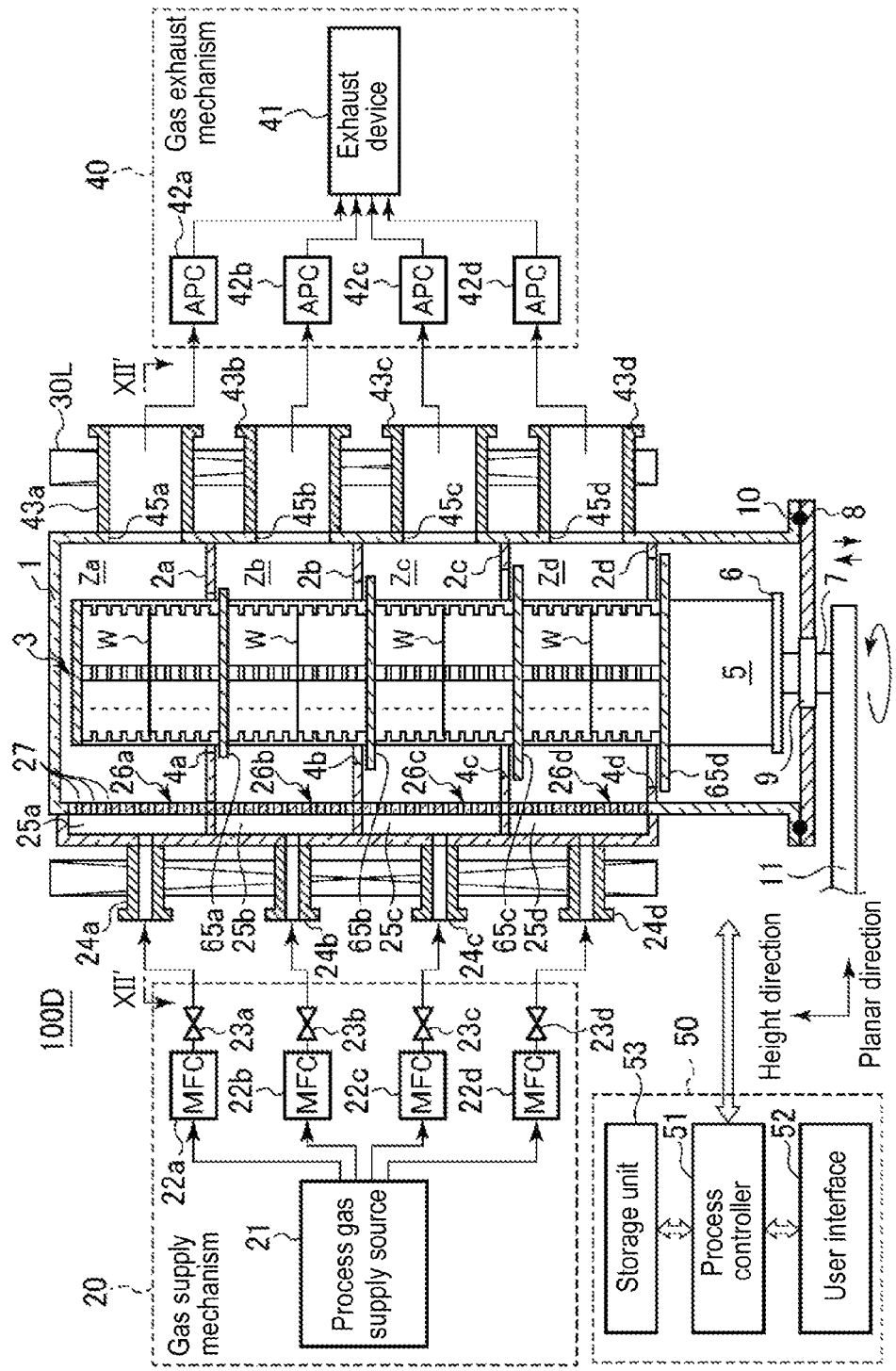
FIG. 12A is a vertical sectional view showing a batch-type vertical substrate processing apparatus according to one example of a second embodiment.
Figure 12B:
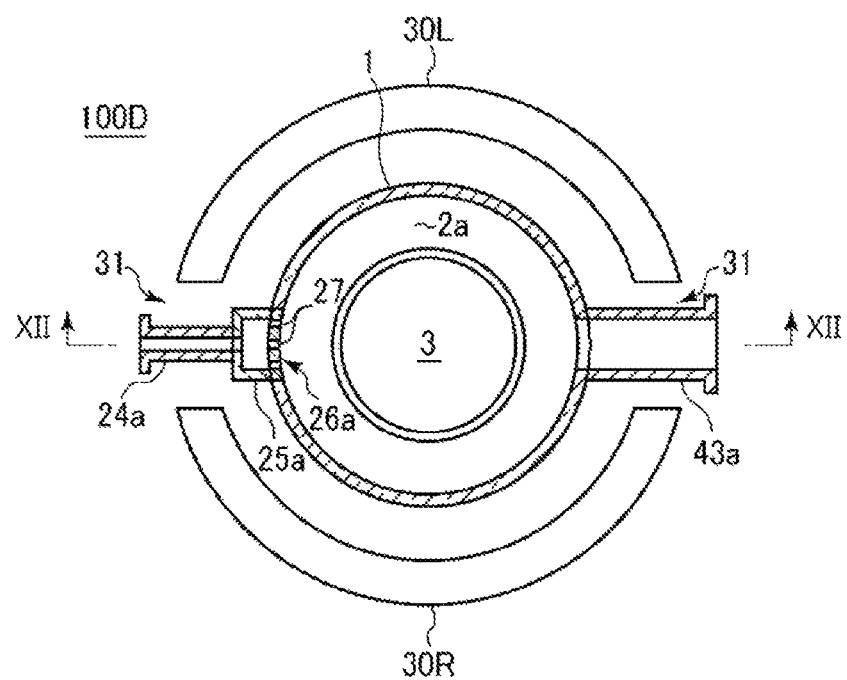
FIG. 12B is a horizontal sectional view showing a batch-type vertical substrate processing apparatus according to one example of a second embodiment.
Figure 13:
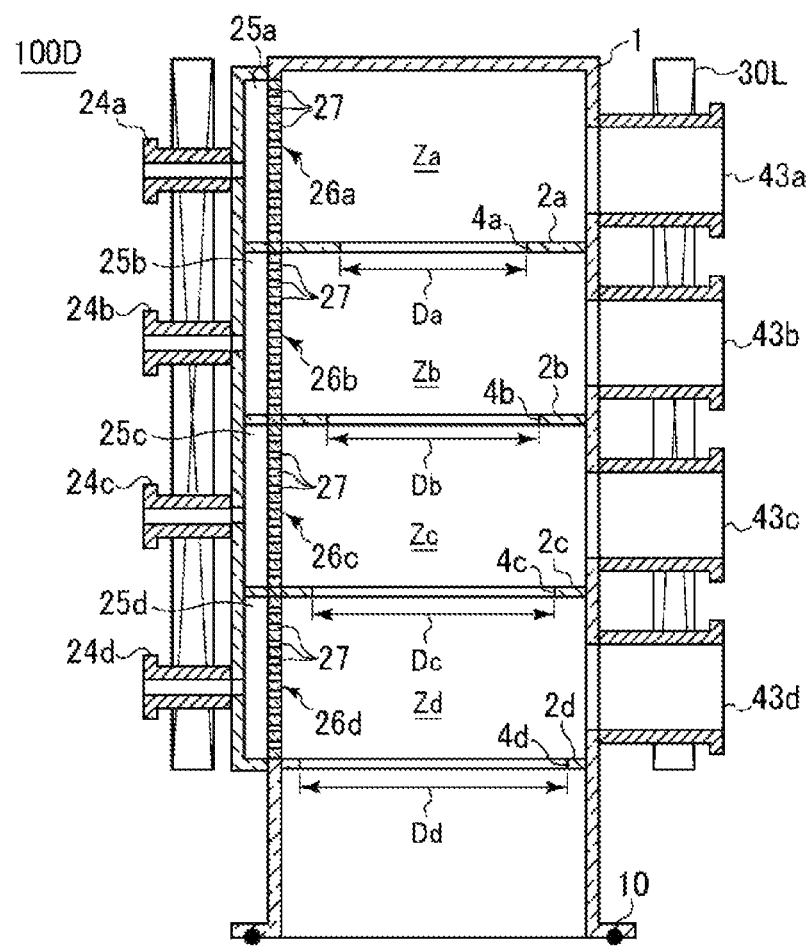
FIG. 13 is a vertical sectional view showing a state in which a substrate holder is removed from a batch-type vertical substrate processing apparatus according to one example of a second embodiment.

FIG. 12A is a vertical sectional view showing a batch-type vertical substrate processing apparatus according to one example of a second embodiment. FIG. 12B is a horizontal sectional view thereof. The cross section shown in FIG. 12A is a cross section taken along line XII-XII in FIG. 12B. The cross section shown in FIG. 12B is a cross section taken along line XII'-XII' in FIG. 12A. FIG. 13 is a vertical sectional view showing a state in which a substrate holder is removed from the batch-type vertical substrate processing apparatus according to one example of the second embodiment.

As shown in FIGS. 12A, 12B and 13, the batch-type vertical substrate processing apparatus 100D according to one example of the second embodiment differs from the batch-type vertical substrate processing apparatus 100A described above with reference to FIGS. 1A and 1B, in that the heating device 30 is provided with slit portions 31 extending in the height direction and is divided into two heating devices 30L and 30R.

Another difference resides in that, in the present example, the gas supply pipes 24a to 24d, which serve as some of the gas supply paths, extend in the planar direction through the slit portions 31 and, in the present example, the gas supply pipes 24a to 24d are connected to the gas supply paths 25a to 25d serving as gas diffusion rooms.

A further difference resides in that, in the present example, the gas exhaust pipes 43a to 43d, which serve as some of the gas exhaust paths, extend in the planar direction through the slit portions 31 and are connected to the gas exhaust ports 45a to 45c.

As mentioned above, the embodiment of the present disclosure is not limited to the configuration in which the gas supply paths 25a to 25d and the gas exhaust paths 44a to 44d extend in the height direction and are respectively connected to the processing subspaces Za to Zd through the space defined between the heating device 30 and the processing chamber 1. Alternatively, the embodiment of the present disclosure may be applied to a configuration in which the gas supply paths (the gas supply pipes 24a to 24d in the present example) and the gas exhaust paths (the gas exhaust pipes 43a to 43d) extend in the planar direction and are respectively connected to the processing subspaces Za to Zd through the slit portions 31 defined between the heating devices 30L and 30R.

The second embodiment provides an advantage in that the length of the gas supply paths and the length of the gas exhaust paths can be substantially equalized in the respective processing subspaces Za to Zd, so that the difference in the activity of a process gas otherwise caused by the difference in, e.g., the length of the gas supply paths can be eliminated.

Thus, as compared with the first embodiment, it is possible to further enhance the target substrate in-plane and inter-plane processing uniformity.

Second Embodiment

One Modified Example

Next, description will be made on one modified example of the second embodiment. This modified example may be applied to a fourth embodiment which will be described later.

<Substrate Processing Apparatus>

Figure 14A:
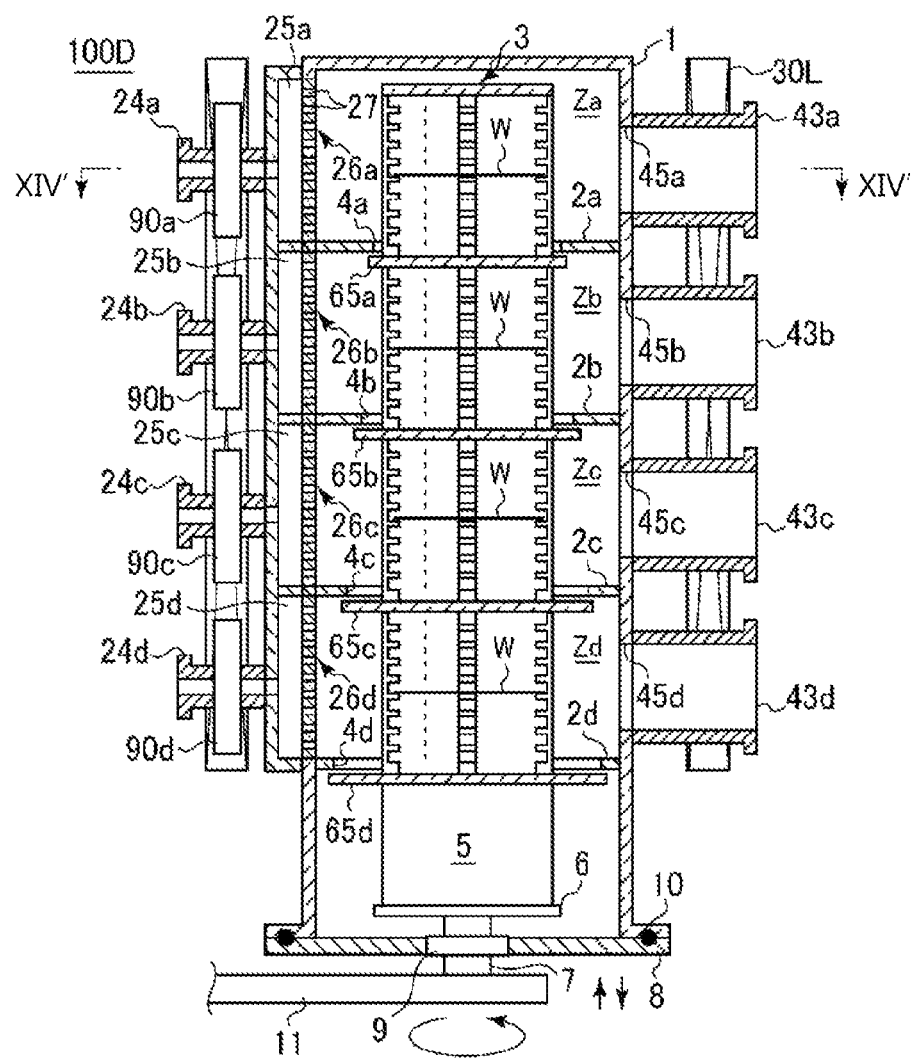
FIG. 14A is a vertical sectional view showing a batch-type vertical substrate processing apparatus according to one modified example of a second embodiment.
Figure 14B:
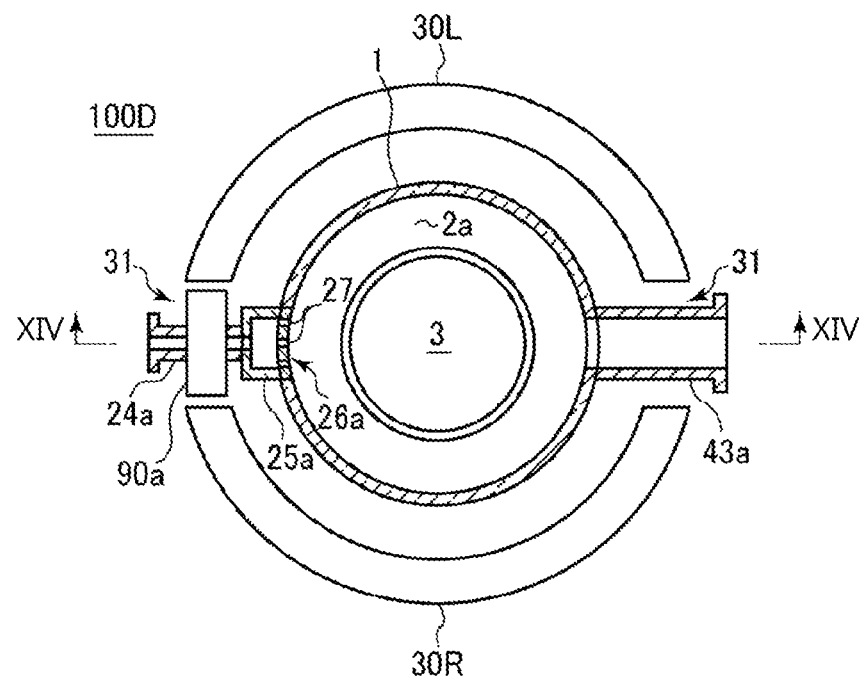
FIG. 14B is a horizontal sectional view showing the batch-type vertical substrate processing apparatus according to one modified example of a second embodiment.

FIG. 14A is a vertical sectional view showing a batch-type vertical substrate processing apparatus according to one modified example of the second embodiment. FIG. 14B is a horizontal sectional view thereof. The cross section shown in FIG. 14A is a cross section taken along line XIV'-XIV' in FIG. 14B. The cross section shown in FIG. 14B is a cross section taken along line XIV-XIV in FIG. 14A.

If, for example, the gas supply paths are formed to extend along the planar direction as in the second embodiment, a flow length of a process gas in the gas supply paths tends to become short. For that reason, there is a possibility that the process gas supplied into the processing subspaces Za to Zd will result in an activity level that is not sufficiently high.

In order to reduce such a possibility, as shown in FIGS. 14A and 14B, preliminary reaction units 90a to 90d for causing the process gas to react in advance to increase the activity thereof in advance may be installed on the portions of the gas supply pipes 24a to 24d among the gas supply paths at the slit portions 31 in the present example.

As the preliminary reaction units 90a to 90d are installed in the batch-type vertical substrate processing apparatus 100D, it is possible to obtain an advantage in that the process gas can be supplied into the processing subspaces Za to Zd while increasing the activity of the process gas in advance or controlling the activity of the process gas in advance. If the activity of the process gas is controlled in advance, it is possible to independently control the activity of the process gas in the preliminary reaction units 90a to 90d corresponding to the respective processing subspaces Za to Zd. This modified example is effective in enhancing the target substrate in-plane and inter-plane processing uniformity.

One major purpose of the preliminary reaction units 90a to 90d is to preliminarily react or activate the process gas. A number of methods can be used to preliminarily react or activate the process gas. Examples of such methods will now be described by referring to one of the preliminary reaction units 90a to 90d installed in multiple stages along the height direction.

First Example

Figure 15A:
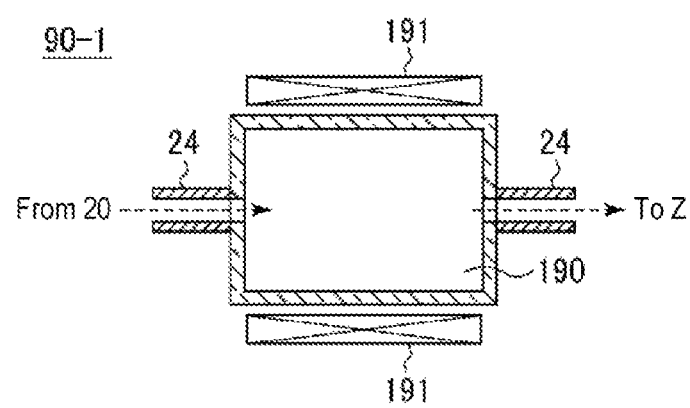
FIG. 15A is a sectional view showing a first example of a preliminary reaction unit.

FIG. 15A is a sectional view showing a first example of the preliminary reaction unit 90-1.

As shown in FIG. 15A, the preliminary reaction unit 90-1 according to the first example includes a preliminary reaction chamber 190 connected to the gas supply pipe 24. The process gas transferred from the gas supply mechanism 20 through the gas supply pipe 24 is preliminarily reacted or activated within the preliminary reaction chamber 190. The process gas, which is preliminarily reacted or activated within the preliminary reaction chamber 190, is supplied into the processing subspace Z through the gas supply pipe 24.

In the preliminary reaction unit 90-1 according to the first example, the process gas is heated within the preliminary reaction chamber 190 to preliminarily react or activate the process gas. Thus, the preliminary reaction unit 90-1 according to the first example includes a heating mechanism 191 configured to heat the process gas supplied into the preliminary reaction chamber 190.

The heating mechanism 191, for example, can be commonly installed in the respective preliminary reaction chambers 190 installed in multiple stages along the height direction. Alternatively, a plurality of heating mechanisms can be installed in each of the zones such as an upper zone, a middle zone and a lower zone. Moreover, the heating mechanism may be installed one by one in the respective preliminary reaction chambers 190 installed in multiple stages.

If the heating mechanisms 191 are installed one by one in the respective zones or the respective preliminary reaction chambers 190, it is possible to independently control the heating mechanisms 191 with respect to the respective zones or the respective preliminary reaction chambers 190. This makes it possible to obtain an advantage in that the process gas can be supplied into the processing subspaces Z while adjusting the activity of the process gas with respect to the respective zones or the respective preliminary reaction chambers 190.

Second Example

Figure 15B:
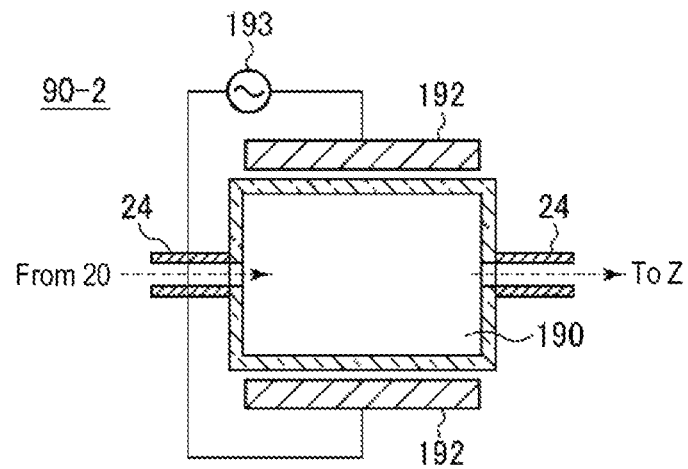
FIG. 15B is a sectional view showing a second example of a preliminary reaction unit.

FIG. 15B is a sectional view showing a second example of the preliminary reaction unit 90.

As shown in FIG. 15B, the second example differs from the first example in that the means for applying energy to the process gas is changed from "heat" to "plasma".

The preliminary reaction unit 90-2 according to the second example includes a pair of electrodes 192 configured to apply high-frequency electric fields to the process gas supplied into the preliminary reaction chamber 190 in order to preliminarily react or activate the process gas and a high-frequency power supply 193 configured to apply high-frequency power to the pair of electrodes 192.

As with the heating mechanism 191, the pair of electrodes 192, for example, can be installed common to the respective preliminary reaction chambers 190 installed in multiple stages along the height direction. Alternatively, multiple pairs of electrodes may be installed in each of zones such as an upper zone, a middle zone and a lower zone. Moreover, multiple pairs of electrodes may be installed one by one in the respective preliminary reaction chambers 190 installed in multiple stages.

If the multiple pairs of electrodes 192 are installed one by one in the respective zones or the respective preliminary reaction chambers 190, it is possible to independently perform the application of high-frequency power to the multiple pairs of electrodes 192 with respect to the respective zones or the respective preliminary reaction chambers 190. This makes it possible to obtain an advantage in that the process gas can be supplied into the processing subspaces Z while adjusting the activity of the process gas with respect to the respective zones or the respective preliminary reaction chambers 190.

Third Example

Figure 15C:
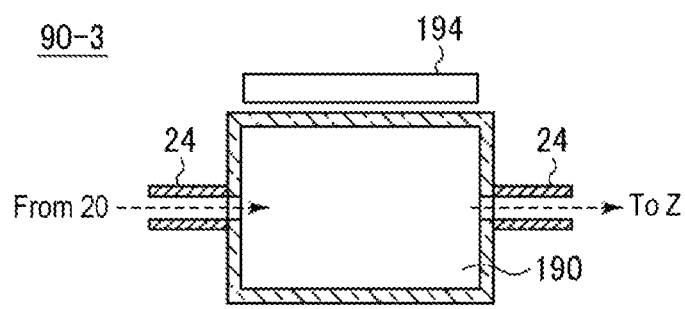
FIG. 15C is a sectional view showing a third example of a preliminary reaction unit.

FIG. 15C is a sectional view showing a third example of the preliminary reaction unit 90.

As shown in FIG. 15C, the third example differs from the first example in that the means for applying energy to the process gas employs "electromagnetic waves". One example of the electromagnetic waves is ultraviolet rays.

The preliminary reaction unit 90-3 according to the third example includes an ultraviolet ray irradiation device 194 configured to irradiate electromagnetic waves, e.g., ultraviolet rays, on the process gas supplied into the preliminary reaction chamber 190 in order to preliminarily react or activate the process gas.

As with the heating mechanism 191 and the pair of electrodes 192, the ultraviolet ray irradiation device 194, for example, can be installed common to the respective preliminary reaction chambers 190 installed in multiple stages along the height direction. Alternatively, a plurality of ultraviolet ray irradiation devices may be installed in each of the zones such as an upper zone, a middle zone and a lower zone. Moreover, a plurality of ultraviolet ray irradiation devices may be installed one by one in the respective preliminary reaction chambers 190 installed in multiple stages.

If the ultraviolet ray irradiation devices 194 are installed one by one in the respective zones or the respective preliminary reaction chambers 190, it is possible to independently perform the irradiation of ultraviolet rays into the preliminary reaction chambers 190 with respect to the respective zones or the respective preliminary reaction chambers 190. This makes it possible to obtain an advantage in that the process gas can be supplied into the processing subspaces Z while adjusting the activity of the process gas with respect to the respective zones or the respective preliminary reaction chambers 190.

In the first to third examples, "heat", "high-frequency electric fields" or "electromagnetic waves" is used as an energy source for preliminarily reacting or activating the process gas. However, the energy source for preliminarily reacting or activating the process gas may not be limited thereto. It is also possible to appropriately combine the energy sources such as "heat," "high-frequency electric fields," "electromagnetic waves" and the like.

Modified Example

In the first to third examples, the preliminary reaction chamber 190 is installed to supply the process gas into the processing subspaces Z after preliminarily reacting or activating the process gas or while preliminarily reacting or activating the process gas.

Figure 15D:
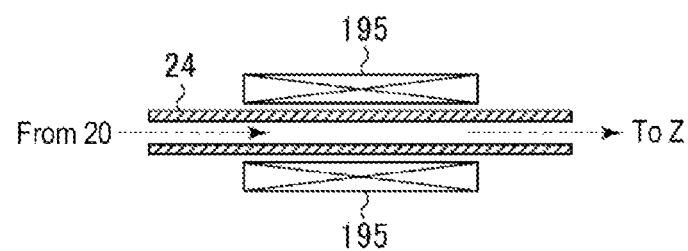
FIG. 15D is a sectional view showing a modified example of a preliminary reaction unit.

However, instead of installing the preliminary reaction chamber 190, the energy source such as "heat", "high-frequency electric fields" or "electromagnetic waves" for activating the process gas may be directly applied to the process gas flowing through the gas supply pipes 24. In the modified example shown in FIG. 15D, as one example thereof, there is illustrated a heating mechanism 195 which applies heat to the gas supply pipe 24 to preliminarily react or activate the process gas flowing through the gas supply pipe 24. Needless to say, the heating mechanism 195 may be changed to the pair of electrodes described in the second example or the ultraviolet ray irradiation device described in the third example.

Third Embodiment

Next, description will be made on a third embodiment of the present disclosure.
<Substrate Processing Apparatus>

Figure 16B:
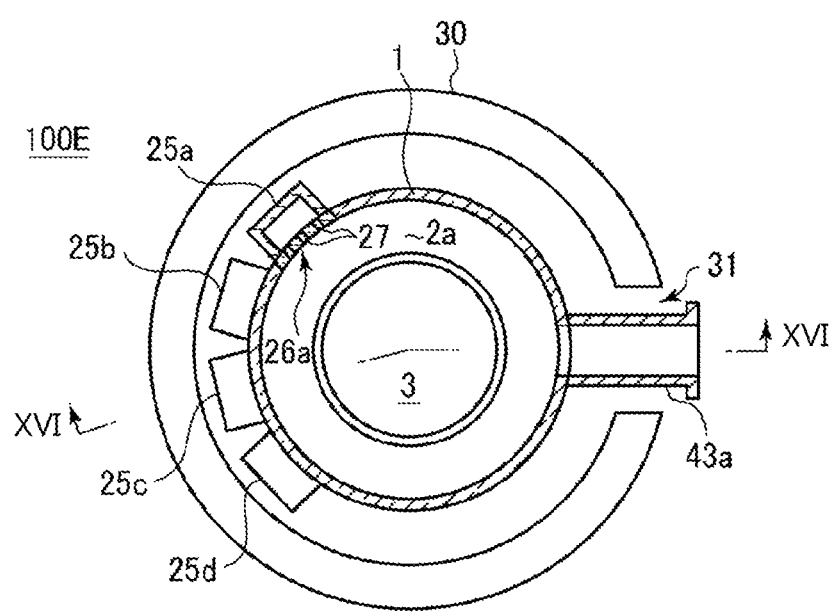
FIG. 16B is a horizontal sectional view showing a batch-type vertical substrate processing apparatus according to one example of a third embodiment.

FIG. 16A is a vertical sectional view showing a batch-type vertical substrate processing apparatus according to one example of a third embodiment. FIG. 16B is a horizontal sectional view thereof. The cross section shown in FIG. 16A is a cross section taken along line XVI-XVI in FIG. 16B. The cross section shown in FIG. 16B is a cross section taken along line XVI'-XVI' in FIG. 16A.

As shown in FIGS. 16A and 16B, the batch-type vertical substrate processing apparatus 100E according to one example of the third embodiment differs from the batch-type vertical substrate processing apparatus 100A described above with reference to FIGS. 1A and 1B, in that the configuration of the first embodiment is employed in its gas supply system and the configuration of the second embodiment is employed in its gas exhaust system.

In this way, the first embodiment and the second embodiment may be appropriately combined and implemented.

Fourth Embodiment

Next, description will be made on a fourth embodiment of the present disclosure.

<Substrate Processing Apparatus>

Figure 17B:
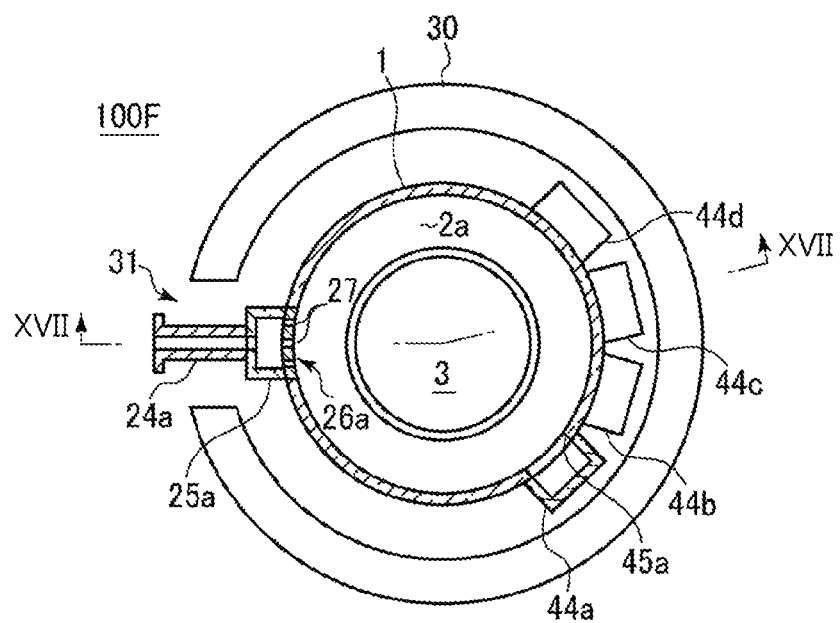
FIG. 17B is a horizontal sectional view showing a batch-type vertical substrate processing apparatus according to one example of a fourth embodiment.

FIG. 17A is a vertical sectional view showing a batch-type vertical substrate processing apparatus according to one example of a fourth embodiment. FIG. 17B is a horizontal sectional view thereof. The cross section shown in FIG. 17A is a cross section taken along line XVII-XVII in FIG. 17B. The cross section shown in FIG. 17B is a cross section taken along line XVII'-XVII' in FIG. 17A.

As shown in FIGS. 17A and 17B, in the batch-type vertical substrate processing apparatus 100F according to one example of the fourth embodiment, contrary to the batch-type vertical substrate processing apparatus 100E according to one example of the third embodiment, the configuration of the second embodiment is employed in its gas supply system and the configuration of the first embodiment is employed in its gas exhaust system.

The first embodiment and the second embodiment may be combined in this manner.

For example, while the processing chamber is divided into four processing subspaces Za to Zd in the aforementioned embodiments, the number of the processing subspaces may not be limited there but may be set arbitrarily. In addition, the present disclosure may be modified or changed in many different forms without departing from the spirit of the present disclosure.

According to the present disclosure, it is possible to provide a batch-type vertical substrate processing apparatus which can suppress deterioration of sealability of processing subspaces even if a substrate holder becomes tall, and a substrate holder which can be suitably used in the batch-type vertical substrate processing apparatus.

While certain embodiments have been described, these embodiments have been presented by way of example only, and are not intended to limit the scope of the disclosures. Indeed, the novel apparatuses and holders described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A batch-type vertical substrate processing apparatus, comprising:
    a processing chamber into which a substrate holder configured to stack and hold a plurality of target substrates in a height direction and to rotate within the processing chamber while the target substrates are processed is inserted;
    a heating device installed outside the processing chamber and configured to heat an interior of the processing chamber;
    a plurality of flanges formed to protrude from an inner wall of the processing chamber toward an internal space of the processing chamber along a planar direction and configured to divide the interior of the processing chamber into a plurality of processing subspaces along the height direction;
    a gas supply mechanism configured to supply a process gas into the processing subspaces; and
    a gas exhaust mechanism configured to exhaust the process gas from the processing subspaces,
    wherein the flanges include insertion holes through which the substrate holder is inserted, and diameters of the insertion holes are small at an upper side of the processing chamber and become gradually larger toward a lower side of the processing chamber,
    wherein the substrate holder includes a plurality of division plates configured to divide a holding part for holding the target substrates into a plurality of processing subspace holding parts corresponding to the processing subspaces along the height direction, the division plates installed to correspond to the respective flanges,
    wherein diameters of the division plates are small at an upper side of the substrate holder and become gradually larger toward a lower side of the substrate holder, and
    wherein a clearance portion is located between a lower surface of each of the flanges extending in the planar direction and an upper surface of each of the division plates extending in the planar direction.

2. The apparatus of claim 1, wherein the clearance portion has a labyrinth structure.

3. The apparatus of claim 2, wherein the labyrinth structure includes a concave portion annularly formed in one surface of the lower surface of each of the flanges and the upper surface of each of the division plates and a convex portion annularly formed in the other surface of the lower surface of each of the flanges and the upper surface of each of the division plates, the convex portion fitted to the concave portion in a contactless state.

4. The apparatus of claim 1, wherein at least one of the target substrates is held in each of the processing subspace holding parts and at least one of the target substrates is processed in each of the processing subspaces.

5. The apparatus of claim 1, wherein the clearance portion has a height direction dimension of 3 mm or more and less than 5 mm.

6. The apparatus of claim 1, further comprising:
    partition walls disposed along an inner wall of the processing chamber between the flanges to divide the processing chamber such that an inner diameter of the processing subspaces becomes smaller than an inner diameter of the processing chamber.

7. The apparatus of claim 6, wherein a distance between the partition walls and outer peripheral end portions of the target substrates held in the substrate holder along the planar direction is set smaller than a holding pitch of the target substrates of the substrate holder along the height direction.

8. The apparatus of claim 1, wherein the gas supply mechanism is connected to gas supply paths installed to correspond to the respective processing subspaces, and the gas supply paths are connected to the respective processing subspaces through a space defined between the heating device and an outer wall of the processing chamber.

9. The apparatus of claim 1, wherein the heating device includes a slit portion extending in the height direction, the gas supply mechanism is connected to gas supply paths installed to correspond to the respective processing subspaces, and the gas supply paths are connected to the processing subspaces through the slit portion.

10. The apparatus of claim 1, wherein the process gas is supplied into insides of the processing subspaces after being preliminarily reacted or activated or while being preliminarily reacted or activated.

11. The apparatus of claim 10, further comprising:
a preliminary reaction unit configured to preliminarily react or activate the process gas.

12. The apparatus of claim 10, wherein at least one of heat, high-frequency electric fields and electromagnetic waves is applied to the process gas in order to preliminarily react or activate the process gas.

13. The apparatus of claim 1, wherein the gas supply mechanism is configured to independently control a supply amount of the process gas with respect to each of the processing subspaces.

14. The apparatus of claim 1, wherein the gas exhaust mechanism is connected to gas exhaust paths installed to correspond to the respective processing subspaces, and the gas exhaust paths are connected to the processing subspaces through a space defined between the heating device and an outer wall of the processing chamber.

15. The apparatus of claim 1, wherein the heating device includes a slit portion extending in the height direction, the gas exhaust mechanism is connected to gas exhaust paths installed to correspond to the respective processing subspaces, and the gas supply paths are connected to the processing subspaces through the slit portion.

16. The apparatus of claim 1, wherein the gas exhaust mechanism is configured to independently control an exhaust amount of the process gas with respect to each of the processing subspaces.

17. The apparatus of claim 1, wherein the heating device is divided into heating devices corresponding to the respective processing subspaces so as to independently control temperatures of the processing subspaces in the respective processing subspaces.

* * * * *